United States Patent
Yonezawa et al.

(10) Patent No.: US 10,244,626 B2
(45) Date of Patent: Mar. 26, 2019

(54) ADHESIVE COMPOSITION FOR PRINTED WIRING BOARDS, BONDING FILM, COVERLAY, COPPER-CLAD LAMINATE AND PRINTED WIRING BOARD

(71) Applicants: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

(72) Inventors: Takayuki Yonezawa, Osaka (JP); Shingo Kaimori, Osaka (JP); Jun Sugawara, Osaka (JP); Shogo Asai, Shiga (JP); Yoshifumi Uchita, Shiga (JP); Masaya Kakimoto, Shiga (JP)

(73) Assignees: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

( * ) Notice: Subject to any disclaimer, the term of this patent is extended or adjusted under 35 U.S.C. 154(b) by 0 days.

(21) Appl. No.: 14/916,191

(22) PCT Filed: Sep. 8, 2014

(86) PCT No.: PCT/JP2014/073647
§ 371 (c)(1),
(2) Date: Mar. 3, 2016

(87) PCT Pub. No.: WO2015/037555
PCT Pub. Date: Mar. 19, 2015

(65) Prior Publication Data
US 2016/0198570 A1    Jul. 7, 2016

(30) Foreign Application Priority Data
Sep. 12, 2013  (JP) .................. 2013-189895

(51) Int. Cl.
*B32B 15/08* (2006.01)
*H05K 1/05* (2006.01)
(Continued)

(52) U.S. Cl.
CPC ............... *H05K 1/056* (2013.01); *B32B 7/12* (2013.01); *B32B 15/08* (2013.01); *B32B 15/20* (2013.01);
(Continued)

(58) Field of Classification Search
None
See application file for complete search history.

(56) References Cited

U.S. PATENT DOCUMENTS 5,406,124 A * 4/1995 Morita ............... C08G 73/1071
257/666
2007/0269665 A1* 11/2007 Shimoohsako ......... B32B 15/08
428/458
(Continued)

FOREIGN PATENT DOCUMENTS

JP    2000-223805 A    8/2000
JP    2000-226566 A    8/2000
(Continued)

OTHER PUBLICATIONS

Notification of the First Office Action dated Dec. 5, 2017 for corresponding Chinese patent application No. 201480050270.1 (9 pages) and its English-language translation thereof (8 pages).

*Primary Examiner* — Seth Dumbris
(74) *Attorney, Agent, or Firm* — Drinker Biddle & Reath LLP

(57) ABSTRACT

An object of the present invention is to provide an adhesive composition for a printed wiring board, the adhesive composition having a good heat resistance. Another object of the
(Continued)

EVALUATION SAMPLE 1 present invention is to provide a coverlay for a printed wiring board, a copper-clad laminate, and a printed wiring board, all of which use the adhesive composition for a printed wiring board. The present invention provides an adhesive composition for a printed wiring board, the adhesive composition containing a siloxane-modified polyimide that includes structural units represented by formulae (1) and (2) below, an epoxy resin, and an inorganic filler. The siloxane-modified polyimide has a weight-average molecular weight (Mw) of 25,000 or more and 150,000 or less. A content of the inorganic filler is 10 parts by mass or more and 100 parts by mass or less relative to 100 parts by mass of the siloxane-modified polyimide. In formulae (1) and (2), Ar represents a tetravalent aromatic tetracarboxylic acid residue, m is 0.35 or more and 0.75 or less, and n is 0.25 or more and 0.65 or less. $R^1$ in formula (1) represents a divalent diamine siloxane residue, and $R^2$ in formula (2) represents a divalent aromatic diamine residue.

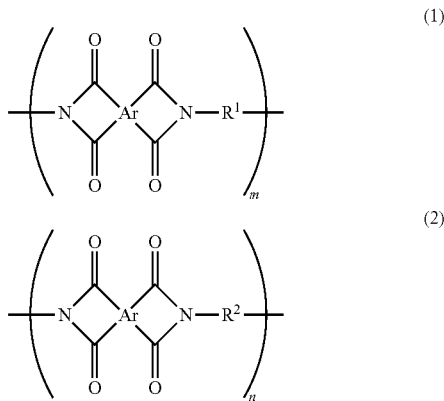

11 Claims, 2 Drawing Sheets

(51) Int. Cl.
C09J 179/08 (2006.01)
C08G 73/10 (2006.01)
C08G 77/455 (2006.01)
C09J 183/10 (2006.01)
C08L 63/00 (2006.01)
B32B 7/12 (2006.01)
B32B 15/20 (2006.01)
B32B 27/20 (2006.01)
B32B 27/28 (2006.01)
B32B 27/38 (2006.01)
H05K 3/38 (2006.01)
H05K 3/46 (2006.01)
C08K 3/34 (2006.01)
C09J 7/10 (2018.01)

(52) U.S. Cl.
CPC ............ *B32B 27/20* (2013.01); *B32B 27/281* (2013.01); *B32B 27/38* (2013.01); *C08G 73/105* (2013.01); *C08G 73/106* (2013.01); *C08G 73/1042* (2013.01); *C08G 73/1082* (2013.01); *C08G 77/455* (2013.01); *C08K 3/34* (2013.01); *C08L 63/00* (2013.01); *C09J 7/10* (2018.01); *C09J 179/08* (2013.01); *C09J 183/10* (2013.01); *H05K 3/386* (2013.01); *H05K 3/4673* (2013.01); *B32B 2264/10* (2013.01); *B32B 2307/202* (2013.01); *B32B 2307/306* (2013.01); *B32B 2307/7265* (2013.01); *B32B 2457/08* (2013.01); *C09J 2463/00* (2013.01); *C09J 2479/08* (2013.01); *H05K 2201/0154* (2013.01); *H05K 2201/0162* (2013.01)

(56) References Cited

U.S. PATENT DOCUMENTS

2009/0317591 A1* 12/2009 Sato ................. B32B 15/08 428/141
2010/0012362 A1* 1/2010 Abe .................. C08G 59/4042 174/259

FOREIGN PATENT DOCUMENTS

| JP | 2003-213241 A | 7/2003 | | |
|---|---|---|---|---|
| JP | 2009-029982 A | 2/2009 | | |
| JP | 2011-157440 A | 8/2011 | | |
| JP | 2011-190425 A | 9/2011 | | |
| JP | 5514060 B2 | 6/2014 | | |
| WO | WO2009147997 | * | 12/2009 | ............ C08L 79/08 |
| WO | WO2011052376 | * | 5/2011 | ............ H05K 3/386 |
| WO | WO 2012/172972 A1 | | 12/2012 | |
| WO | WO2012172972 | * | 12/2012 | ............ H05K 1/0346 |

* cited by examiner

EVALUATION SAMPLE 1

EVALUATION SAMPLE 2

EVALUATION SAMPLE 4

ADHESIVE COMPOSITION FOR PRINTED WIRING BOARDS, BONDING FILM, COVERLAY, COPPER-CLAD LAMINATE AND PRINTED WIRING BOARD

TECHNICAL FIELD

The present invention relates to an adhesive composition for a printed wiring board, a bonding film, a coverlay, a copper-clad laminate, and a printed wiring board.

BACKGROUND ART

In recent years, with the computerization of automobile systems, the number of engine control units installed in an automobile has been increasing. Meanwhile, with an increase in the needs for energy saving and a reduction in the weight of automobiles, a reduction in the size of automobiles has been desired, and the expectations for flexible printed wiring boards have been increasing accordingly. A flexible printed wiring board is formed by, for example, attaching a copper foil on a front surface side of a base film formed of a polyimide resin, etching the copper foil to form a conductive pattern, and then stacking a cover film by using an adhesive so as to cover the surface of the conductive pattern. This cover film is formed of a polyimide resin or the like and has a function of oxidation prevention, insulation, and protection of the conductive pattern.

However, in the case where a flexible printed wiring board is assumed to be used in an engine control unit in the periphery of an automobile engine, heat resistance equal to or higher than that in other places is necessary. For example, heat resistance at 150° C. is necessary in the periphery of an engine. In existing general-purpose flexible printed wiring boards, polyimides and copper circuits, which are materials of the printed wiring boards, have sufficient heat resistance. However, adhesives used for stacking these components have poor heat resistance, and thus applications of flexible printed wiring boards to the periphery of an engine have not been realized in the present situation. In view of this, adhesives have been examined in order to improve the heat resistance of flexible printed wiring boards (Japanese Unexamined Patent Application Publication Nos. 2011-190425, 2011-157440, 2003-213241, and 2000-226566).

CITATION LIST

Patent Literature

PTL 1: Japanese Unexamined Patent Application Publication No. 2011-190425
PTL 2: Japanese Unexamined Patent Application Publication No. 2011-157440
PTL 3: Japanese Unexamined Patent Application Publication No. 2003-213241
PTL 4: Japanese Unexamined Patent Application Publication No. 2000-226566

SUMMARY OF INVENTION

Technical Problem

However, use of the adhesives described in the above patent publications may not ensure heat resistance at 150° C. for 1,000 hours, which is assumed to be necessary at least for engine control units in the periphery of an automobile engine.

The present invention has been made in view of the above circumstances, and an object of the present invention is to provide an adhesive composition for a printed wiring board, the adhesive composition having a good heat resistance. Another object of the present invention is to provide a bonding film for a printed wiring board, a coverlay, a copper-clad laminate, and a printed wiring board, all of which use the adhesive composition for a printed wiring board.

Solution to Problem

An invention which has been made to solve the above problem provides an adhesive composition for a printed wiring board, the adhesive composition containing a siloxane-modified polyimide that includes a first structural unit represented by formula (1) below and a second structural unit represented by formula (2) below, an epoxy resin, and an inorganic filler, in which the siloxane-modified polyimide has a weight-average molecular weight (Mw) of 25,000 or more and 150,000 or less, and a content of the inorganic filler is 10 parts by mass or more and 100 parts by mass or less relative to 100 parts by mass of the siloxane-modified polyimide.

[Chem. 1]

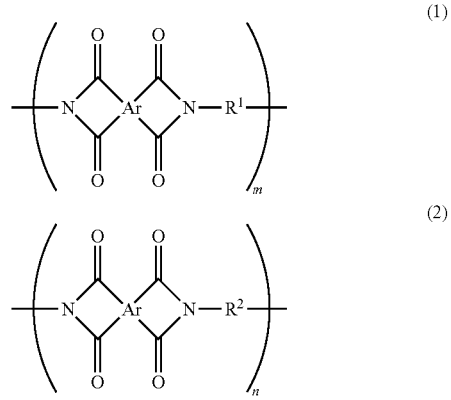

(In formulae (1) and (2), Ar represents a tetravalent aromatic tetracarboxylic acid residue.

In formula (1), $R^1$ represents a divalent diamine siloxane residue.

In formula (2), $R^2$ represents a divalent aromatic diamine residue.

In formula (1) above, m represents a molar ratio of the first structural unit to the total structural units of the siloxane-modified polyimide and is 0.35 or more and 0.75 or less.

In formula (2) above, n represents a molar ratio of the second structural unit to the total structural units of the siloxane-modified polyimide and is 0.25 or more and 0.65 or less.

However, there is no case where a total of m and n exceeds 1.)

Another invention which has been made to solve the above problem provides a bonding film for a printed wiring board, the bonding film being formed from the adhesive composition for a printed wiring board.

Still another invention which has been made to solve the above problem provides a coverlay for a printed wiring board, the coverlay including a cover film, and an adhesive layer stacked on one surface of the cover film and formed from the adhesive composition for a printed wiring board.

Still another invention which has been made to solve the above problem provides a copper-clad laminate including a base film, an adhesive layer stacked on one or both surfaces of the base film and formed from the adhesive composition for a printed wiring board, and a copper foil stacked on the adhesive layer.

Still another invention which has been made to solve the above problem provides a printed wiring board including a base film, a conductive pattern stacked on the base film either directly or with another layer therebetween, and a coverlay stacked on the base film and the conductive pattern, in which the coverlay is the above-described coverlay for a printed wiring board.

Advantageous Effects of Invention

The adhesive composition for a printed wiring board of the present invention can provide an adhesive layer having a good heat resistance. Accordingly, the adhesive composition for a printed wiring board can be suitably used in a bonding film for a printed wiring board, a coverlay, a copper-clad laminate, and a printed wiring board, and in particular, can be suitably used in a printed wiring board used in a high-temperature environment.

DESCRIPTION OF EMBODIMENTS

[Description of Embodiments of Invention]

Figure 1:
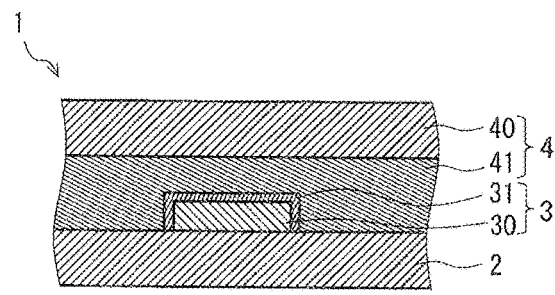
FIG. 1 is a schematic cross-sectional view illustrating the relevant part of a flexible printed wiring board according to an embodiment of the present invention.

The present invention provides an adhesive composition for a printed wiring board, the adhesive composition containing a siloxane-modified polyimide that includes a first structural unit represented by formula (1) below and a second structural unit represented by formula (2) below, an epoxy resin, and an inorganic filler, in which the siloxane-modified polyimide has a weight-average molecular weight (Mw) of 25,000 or more and 150,000 or less, and a content of the inorganic filler is 10 parts by mass or more and 100 parts by mass or less relative to 100 parts by mass of the siloxane-modified polyimide.

[Chem. 2]

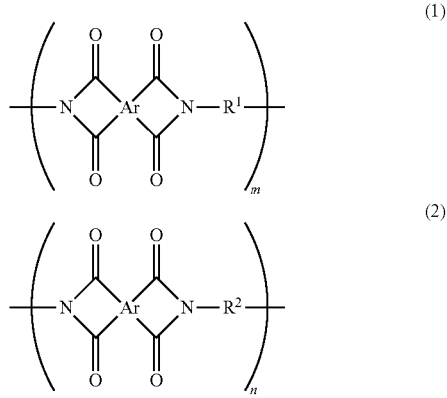

(In formulae (1) and (2), Ar represents a tetravalent aromatic tetracarboxylic acid residue.

In formula (1), $R^1$ represents a divalent diamine siloxane residue.

In formula (2), $R^2$ represents a divalent aromatic diamine residue.

In formula (1) above, m represents a molar ratio of the first structural unit to the total structural units of the siloxane-modified polyimide and is 0.35 or more and 0.75 or less.

In formula (2) above, n represents a molar ratio of the second structural unit to the total structural units of the siloxane-modified polyimide and is 0.25 or more and 0.65 or less.

However, there is no case where a total of m and n exceeds 1.)

The adhesive composition contains a siloxane-modified polyimide that includes a structural unit containing a diamine siloxane residue and represented by formula (1) above and a structural unit containing an aromatic diamine residue and represented by formula (2) above. In this siloxane-modified polyimide, the ratio of the structural unit represented by formula (1) above is 0.35 or more and 0.75 or less, and the ratio of the structural unit represented by formula (2) above is 0.25 or more and 0.65 or less. The number of siloxane residues in the molecule is substantially the same as the number of aromatic diamine residues. Thus, the siloxane-modified polyimide used in the adhesive composition does not contain a siloxane residue, which may decrease short-term heat resistance, in an excessive amount. As a result, the adhesive composition can suppress a decrease in heat resistance and moisture resistance and a decrease in oil resistance of an adhesive layer formed using the adhesive composition.

The adhesive composition contains an epoxy resin. The epoxy resin is believed to act as a crosslinking agent of the siloxane-modified polyimide. Accordingly, it is believed that the siloxane-modified polyimide is crosslinked by the epoxy resin, thereby improving the heat resistance, moisture resistance, and strength of an adhesive layer formed using the adhesive composition.

Furthermore, by controlling the weight-average molecular weight (Mw) of the siloxane-modified polyimide in the above range, in particular, by controlling the weight-average molecular weight (Mw) to 150,000 or less, aggregation of the siloxane-modified polyimide can be suppressed. Therefore, since the adhesive composition contains such a siloxane-modified polyimide, a decrease in peel strength due to aggregation of the siloxane-modified polyimide can be suppressed. As a result, the adhesive composition can improve the heat resistance of an adhesive layer formed using the adhesive composition.

In addition, since the adhesive composition contains an inorganic filler, mechanical strength of the adhesive composition can be improved, and peel strength thereof can be improved.

Accordingly, since the adhesive composition contains a siloxane-modified polyimide that does not contain a siloxane residue in an excessive amount and that has a weight-average molecular weight (Mw) in the above range, and contains an epoxy resin and an inorganic filler, not only short-term heat resistance of an adhesive layer formed using the adhesive composition but also heat resistance thereof can be improved. Therefore, the adhesive composition for a printed wiring board can improve the heat resistance of a printed wiring board.

The ratio of the structural unit represented by formula (1) and the ratio of the structural unit represented by formula (2) of the siloxane-modified polyimide are each preferably 0.35 or more and 0.65 or less. When each of the ratio of the structural unit represented by formula (1) above and the ratio of the structural unit represented by formula (2) above is in the above range, heat resistance and moisture resistance of a printed wiring board that uses the adhesive composition for a printed wiring board can be more reliably improved, and oil resistance thereof can be further improved.

The inorganic filler preferably has an average particle size of 2 μm or more and 20 μm or less. When the inorganic filler has an average particle size in the above range, heat resistance of a printed wiring board that uses the adhesive composition for a printed wiring board can be more reliably improved.

The inorganic filler preferably has a plate-like shape, and the inorganic filler preferably has an aspect ratio of 5 or more and 100 or less. When the inorganic filler has an aspect ratio in the above range, heat resistance of a printed wiring board that uses the adhesive composition for a printed wiring board can be more reliably improved.

A content of the epoxy resin is preferably 50 parts by mass or less relative to 100 parts by mass of the siloxane-modified polyimide. When the content of the epoxy resin is in the above range, the siloxane-modified polyimide is suitably crosslinked by the epoxy resin, and it is believed that heat resistance and strength of an adhesive layer formed using the adhesive composition can be further improved.

The adhesive composition preferably further contains a phenolic resin. When a phenolic resin is contained, the epoxy resin can be cured by crosslinking or the like with the phenolic resin. Accordingly, heat resistance and strength can be further improved in addition to the effect of improving heat resistance and strength obtained by crosslinking the siloxane-modified polyimide with the epoxy resin.

The present invention provides a bonding film for a printed wiring board, the bonding film being formed from the adhesive composition for a printed wiring board. Since the bonding film is formed from the adhesive composition for a printed wiring board, the heat resistance of a printed circuit board that uses the bonding film can be improved.

The present invention provides a coverlay for a printed wiring board, the coverlay including a cover film, and an adhesive layer stacked on one surface of the cover film and formed from the adhesive composition for a printed wiring board. Since the coverlay includes an adhesive layer formed from the adhesive composition for a printed wiring board, the heat resistance of a printed wiring board that uses the coverlay can be improved.

The coverlay preferably has flame retardancy that satisfies the UL-94 VTM-0. When the coverlay has the flame retardancy, suitable flame retardancy can be provided to a printed wiring board that uses the coverlay, and the printed wiring board can be suitably used in the periphery of an automobile engine or the like.

The present invention provides a copper-clad laminate including a base film, an adhesive layer stacked on one or both surfaces of the base film and formed from the adhesive composition for a printed wiring board, and a copper foil stacked on the adhesive layer. Since the copper-clad laminate includes an adhesive layer formed from the adhesive composition for a printed wiring board, heat resistance of a printed wiring board formed from the copper-clad laminate can be improved.

The present invention provides a printed wiring board including a base film, a conductive pattern stacked on the base film either directly or with another layer therebetween, and a coverlay stacked on the base film and the conductive pattern, in which the coverlay is the above-described coverlay for a printed wiring board. Since the printed wiring board includes the coverlay described above, the printed wiring board has a good heat resistance.

In the printed wiring board, the conductive pattern preferably includes a base conductor and a surface treatment layer formed on at least a part of an outer surface of the base conductor, and the surface treatment layer preferably contains nickel (Ni), tin (Sn), or aluminum (Al) as a main component. When the conductive pattern includes a surface treatment layer containing the above main component, it is possible to suppress leakage of a conductive component from the conductive pattern, and diffusion of a reactive component in the conductive pattern, the reactive component being reactive with a conductive component of the conductive pattern. By suppressing leakage of the conductive component from the conductive pattern by the surface treatment layer, weakening of the conductive pattern can be suppressed. By suppressing diffusion of the reactive component in the conductive pattern by the surface treatment layer, a reaction between the reactive component and the conductive component of the conductive pattern is suppressed and weakening of the conductive pattern can be suppressed. Consequently, the printed wiring board has excellent heat resistance as a result of the improvement in adhesiveness between the conductive pattern and the adhesive layer.

In particular, in the case where the printed wiring board is used in a high-temperature environment in the periphery of an automobile engine, the printed wiring board is in a state in which reactive components such as oxygen and sulfur contained in an automatic transmission fluid (ATF) oil or the like are rich. However, since the printed wiring board includes the surface treatment layer, weakening of the adhesive layer can be appropriately suppressed even in a high-temperature environment which is exposed to an oil, such as in a periphery of an engine. In addition, since the main component of the surface treatment layer is nickel (Ni), tin (Sn), or aluminum (Al), when the conductive pattern is formed of copper, which is commonly used, leakage of copper from the conductive pattern and diffusion of a component reactive with copper in the conductive pattern can be suppressed more appropriately.

A peel strength between the cover film and a conductive pattern after the printed wiring board is allowed to stand in air at 150° C. for 1,000 hours is preferably 5 N/cm or more. When the peel strength is in this range, the printed wiring board can be suitably used even in a high-temperature environment such as in a periphery of an automobile engine.

A peel strength between the cover film and a conductive pattern after the printed wiring board is immersed in an ATF oil at 150° C. for 1,000 hours is preferably 2 N/cm or more. When the peel strength is in this range, the printed wiring board can be suitably used even in an environment in which an ATF oil or the like is dispersed and heat resistance and oil resistance are required, such as in a periphery of an automobile engine.

A peel strength between the cover film and a conductive pattern after the printed wiring board is allowed to stand in air at 85° C. and 85% for 1,000 hours is preferably 4 N/cm or more. When the printed wiring board has this characteristic, the printed wiring board can be suitably used even in a high-temperature high-humidity environment.

The printed wiring board preferably has a solder heat resistance at 340° C. for 60 seconds. In automobile applications, it is necessary to mount a solder component at a high temperature during component mounting. Furthermore, when repairing, it is necessary to heat solder to a higher temperature. Thus, high solder heat resistance is required for a printed wiring board for automobiles. However, in existing technologies, even when baking to remove moisture is performed before solder mounting, the upper limit of solder heat resistance is 320° C. When the printed wiring board has the above characteristic, the printed wiring board can be suitably used in automobile applications.

Herein, the term "weight-average molecular weight (Mw)" refers to a weight-average molecular weight in terms of polystyrene determined by gel permeation chromatography (GPC). The weight-average molecular weight (Mw) in the present invention is a value measured under the measurement conditions described below.

Measuring device: "HLC-8220GPC" manufactured by Tosoh Corporation
Column: GMH-HR-H
Mobile phase: N-methyl-2-pyrrolidone
Column temperature: 40° C.
Flow rate: 0.5 mL/min
Sample concentration: 1.0% by mass
Amount of sample injected: 10 μL
Detector: differential refractometer
Standard reference: monodisperse polystyrene The term "peel strength" refers to a peeling strength measured in accordance with JIS-K-6854-2:1999 "Adhesives—Determination of peel strength of bonded assemblies—Part 2: 180° peel". This peeling strength can be measured by using, for example, an "Autograph AG-IS" tensile testing machine manufactured by Shimadzu Corporation. The term "peel strength between a cover film and a conductor pattern" refers to peel strength between a cover film and a conductor (for example, copper foil) that is not patterned.

[Details of Embodiments of Invention]

An adhesive composition for a printed wiring board, a bonding film, a coverlay, a copper-clad laminate, and a printed wiring board of the present invention will now be described.

[Adhesive Composition for Printed Wiring Board]

The adhesive composition for a printed wiring board (hereinafter may be referred to as "adhesive composition") contains a siloxane-modified polyimide, an epoxy resin, and an inorganic filler. The adhesive composition preferably contains a curing agent as a preferred component and may contain other optional components as long as the advantages of the present invention are not impaired.

<Siloxane-modified Polyimide>

The siloxane-modified polyimide is a main adhesive component in the adhesive composition. The siloxane-modified polyimide includes a first structural unit represented by formula (1) below and a second structural unit represented by formula (2) below.

[Chem. 3]

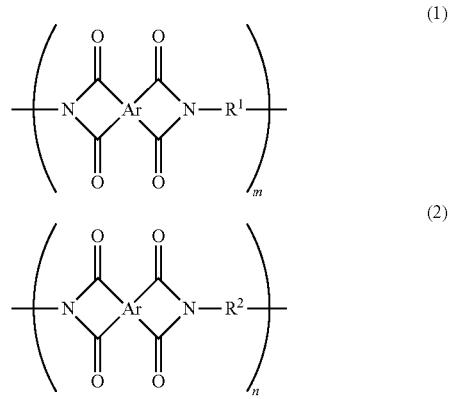

In formulae (1) and (2), Ar represents a tetravalent aromatic tetracarboxylic acid residue.

In formula (1), $R^1$ represents a divalent diamine siloxane residue.

In formula (2), $R^2$ represents a divalent aromatic diamine residue.

Examples of the tetravalent aromatic tetracarboxylic acid residue represented by Ar include tetravalent groups represented by formula (3) or (4) below.

[Chem. 4]

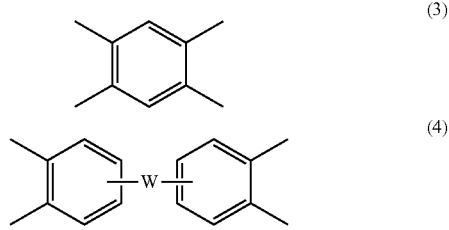

In formula (4), W represents a single bond, a divalent hydrocarbon group having 1 to 15 carbon atoms, —O—, —S—, —CO—, —SO$_2$—, —NH—, or —CONH—. Among these, W is preferably a divalent hydrocarbon group having 1 to 15 carbon atoms, a single bond, or —O—.

Examples of the divalent hydrocarbon group having 1 to 15 carbon atoms and represented by W include linear or branched divalent chain hydrocarbon groups having 1 to 15 carbon atoms, divalent alicyclic hydrocarbon groups having 3 to 15 carbon atoms, divalent aromatic hydrocarbon groups having 6 to 10 carbon atoms, and divalent groups formed by combining these groups.

The divalent diamine siloxane residue represented by $R^1$ is a group having a siloxane bond (—Si—O—Si—). By increasing the ratio of this siloxane bond, sufficient flexibility can be provided to an adhesive layer formed from the adhesive composition even when the amount of plasticizer mixed is reduced. Examples of the divalent diamine siloxane residue include a divalent group represented by formula (5) below.

[Chem. 5]

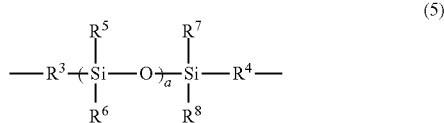

(5)

In formula (5), $R^3$ and $R^4$ each independently represent a single bond or a divalent organic group which may contain an oxygen atom, $R^5$ to $R^8$ each independently represent a hydrocarbon group having 1 to 6 carbon atoms, and a represents an average number of repetitions of a siloxane unit (—$SiR^5R^6$—O—) in the diamine siloxane residue and is an integer of 1 to 20. When a is less than 1, flexibility of an adhesive layer formed from the adhesive composition may decrease. When a exceeds 20, adhesive properties of the adhesive layer may decrease. From this point of view, a is preferably an integer of 5 to 15.

Examples of the divalent aromatic diamine residue represented by $R^2$ include divalent groups represented by formulae (6) to (8) below.

[Chem. 6]

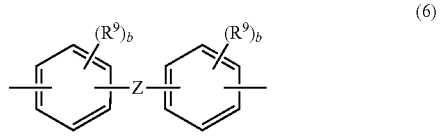

(6)

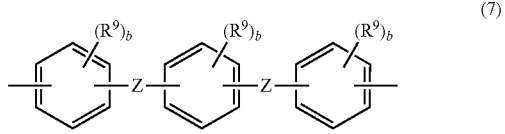

(7)

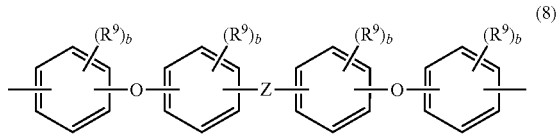

(8)

In formulae (6) to (8), $R^9$ each independently represent a monovalent hydrocarbon group or alkoxy group having 1 to 6 carbon atoms, Z represents a single bond, a divalent hydrocarbon group having 1 to 15 carbon atoms, —O—, —S—, —CO—, —SO$_2$—, —NH—, or —CONH—, and b represents an integer of 0 to 4.

In formula (1) above, m represents a molar ratio of the first structural unit to the total structural units of the siloxane-modified polyimide. In formula (2) above, n represents a molar ratio of the second structural unit to the total structural units of the siloxane-modified polyimide. In the formulae, m is 0.35 or more and 0.75 or less, and n is 0.25 or more and 0.65 or less. However, there is no case where a total of m and n exceeds 1. When m exceeds 0.75 (when n is less than 0.25), short-term heat resistance of an adhesive layer formed from the adhesive composition may decrease. Furthermore, as a result of an increase in moisture permeability of the adhesive layer, peel strength may easily decrease under a high-temperature high-humidity condition. When m is less than 0.35 (when n exceeds 0.65), the ratio of a siloxane bond in the siloxane-modified polyimide is decreased, and sufficient flexibility may not be provided to an adhesive layer formed from the adhesive composition. Furthermore, fluidity of the adhesive composition at low temperature decreases and sufficient peel strength may not be obtained when bonding is performed at 200° C. or lower. When bonding is performed at a temperature exceeding 200° C., a decrease in characteristics caused by oxidation of a conductor layer, generation of a residual stress due to thermal expansion/contraction, or the like may be concerned. In addition, it is necessary to use a special heat-resistant product as an auxiliary member used in a bonding process, such as an auxiliary member for uniformly applying a pressure during heat pressing, and therefore, the production cost increases. Furthermore, when m is less than 0.35 (when n exceeds 0.65), the thermal expansion coefficient of the adhesive layer increases, thereby increasing the difference in thermal expansion coefficient between the adhesive layer and a base film. Consequently, during application and drying of the adhesive composition, a coverlay is easily warped due to the difference in thermal expansion coefficient, and workability may decrease.

The weight-average molecular weight (Mw) of the siloxane-modified polyimide is 25,000 or more and 150,000 or less. The lower limit of the weight-average molecular weight (Mw) is more preferably 40,000, and still more preferably 50,000. The upper limit of the weight-average molecular weight (Mw) is more preferably 125,000, and still more preferably 90,000. When the weight-average molecular weight (Mw) of the siloxane-modified polyimide is less than the lower limit, sufficient peel strength may not be obtained because the cohesive force decreases. In addition, due to a low cohesive force and low peel strength at about 150° C., an oil at about 150° C. may easily permeate through the adhesive layer.

Furthermore, due to a low modulus of elasticity of an adhesive layer formed from the adhesive composition at a reflow temperature of about 260° C., swelling may be caused by a solvent remaining in the adhesive layer. When the weight-average molecular weight (Mw) of the siloxane-modified polyimide exceeds the upper limit, aggregation of molecular chains of the siloxane-modified polyimide easily occurs, which may result in a decrease in peel strength.

<Method for Preparing Siloxane-modified Polyimide>

The siloxane-modified polyimide can be prepared as a polymer solution by, for example, producing a polyamic acid solution using a reaction solution in which an acid anhydride component and a diamine component are added to an organic solvent, and then cyclizing (imidizing) the polyamic acid solution by heating.

An aromatic tetracarboxylic acid anhydride is used as the acid anhydride component.

Examples of the aromatic tetracarboxylic acid anhydride include oxydiphthalic anhydrides. Examples of the oxydiphthalic anhydrides include 3,3',4,4'-biphenyltetracarboxylic dianhydride (BPDA), 4,4'-oxydiphthalic anhydride (synonym: 5,5'-oxybis-1,3-isobenzofurandione) (ODPA), 3,3'-oxydiphthalic anhydride, and 3,4'-oxydiphthalic anhydride. Among these, 3,3',4,4'-biphenyltetracarboxylic dianhydride is preferable. The aromatic tetracarboxylic acid anhydrides exemplified above may be used alone or in combination of two or more compounds.

When an acid anhydride containing 3,3',4,4'-biphenyltetracarboxylic dianhydride is used as the acid anhydride component, the molar ratio of 3,3',4,4'-biphenyltetracarboxylic dianhydride in the acid anhydride is preferably 50% or more, more preferably 80% or more, and still more preferably 100%.

Examples of the aromatic tetracarboxylic acid anhydride further include 3,3',4,4'-biphenyltetracarboxylic dianhydride (BPDA), 3,3',4,4'-benzophenonetetracarboxylic dianhydride (BTDA), 3,3',4,4'-diphenylsulfonetetracarboxylic dianhydride (DSDA), and pyromellitic dianhydride (PMDA). These may be used alone or in combination of two or more compounds. Alternatively, these may be used in combination with 4,4'-oxydiphthalic anhydride (ODPA).

A diaminosiloxane or an aromatic diamine is used as the diamine component.

Examples of the diaminosiloxane include a compound in which amino groups are bonded to two ends of the diamine siloxane residue represented by formula (5) above. By using a diaminosiloxane as a diamine, a siloxane skeleton can be introduced in the siloxane-modified polyimide. Accordingly, fluidity during thermocompression bonding is provided to the adhesive composition, thereby improving a filling property of the adhesive composition between a cover film and a base film in a printed wiring board.

The diaminosiloxane is preferably a compound represented by any of formulae (9) to (13) below. Among these, the diaminosiloxane represented by formula (9) is more preferable. The diaminosiloxanes represented by formulae (9) to (13) below may be used alone or in combination of two or more compounds.

[Chem. 7]

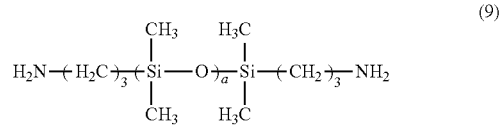
(9)

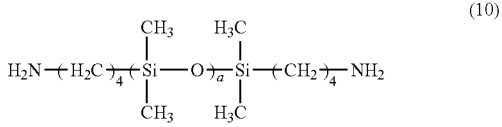
(10)

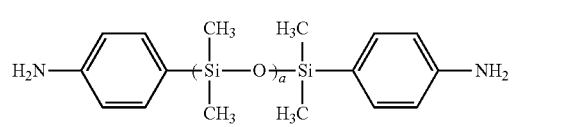
(11)

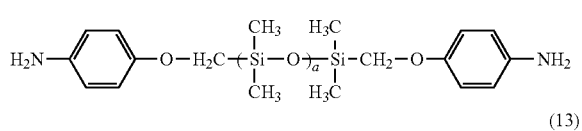
(12)

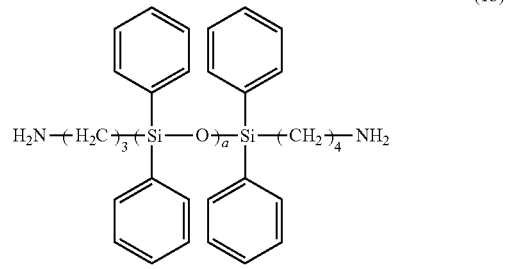
(13)

In formulae (9) to (13), a represents the same as that in formula (5) above.

Examples of the aromatic diamine include 2,2-bis(4-aminophenoxy phenyl)propane (BAPP), 2,2'-divinyl-4,4'-diaminobiphenyl (VAB), 2,2'-dimethyl-4,4'-diaminobiphenyl (m-TB), 2,2'-diethyl-4,4'-diaminobiphenyl, 2,2',6,6'-tetramethyl-4,4'-diaminobiphenyl, 2,2'-diphenyl-4,4'-diaminobiphenyl, and 9,9-bis(4-aminophenyl)fluorene. Among these, 2,2-bis(4-aminophenoxy phenyl)propane (BAPP), 2,2'-divinyl-4,4'-diaminobiphenyl (VAB), and 2,2'-dimethyl-4,4'-diaminobiphenyl (m-TB) are preferable. The aromatic diamines exemplified above may be used alone or in combination of two or more compounds.

A compounding ratio of the aromatic tetracarboxylic acid anhydride to the diamine component (diaminosiloxane and aromatic diamine) in the reaction solution is a substantially equimolar ratio, for example, 45:55 to 55:45. A compounding ratio (molar ratio) of the diaminosiloxane to the aromatic diamine is 35:65 or more and 75:25 or less. When the compounding ratio (molar ratio) of the diaminosiloxane to the aromatic diamine is in the above range, the number of siloxane residues in the siloxane-modified polyimide is substantially the same as the number of aromatic diamine residues. Therefore, in the siloxane-modified polyimide, containing an excessively large amount of the siloxane residue, which may decrease short-term heat resistance, is suppressed. As a result, according to the adhesive composition, short-term heat resistance of the resulting adhesive layer can be improved.

Examples of the organic solvent include N,N-dimethylformamide, N,N-dimethylacetamide (DMAC), N-methyl-2-pyrrolidone, 2-butanone, dimethyl sulfoxide, dimethyl sulfate, cyclohexanone, dioxane, tetrahydrofuran, diglyme, triglyme, xylene, and toluene. These solvents may be used alone or in combination of two or more solvents.

The compounding ratio of the organic solvent in the reaction solution is determined such that the content of a polyamic acid in a polyamic acid solution produced from the reaction solution becomes 5% to 50% by mass, and preferably 10% to 40% by mass.

Regarding conditions for the reaction for producing a polyamic acid, the temperature of the reaction solution is 0° C. to 100° C., and the reaction time is 30 minutes to 24 hours.

The polyamic acid solution can be usually used without further treatment. However, if necessary, the polyamic acid solution may be concentrated, diluted, or substituted with another organic solvent and used.

Imidization of the polyamic acid is performed by, for example, heating the polyamic acid solution at a temperature of 80° C. to 400° C. for 1 to 24 hours.

<Epoxy Resin>

The epoxy resin improves heat resistance and mechanical strength of an adhesive layer formed from the adhesive composition. The epoxy resin is believed to act as a crosslinking agent of the siloxane-modified polyimide. It is believed that, by crosslinking the siloxane-modified polyimide with this epoxy resin, the cohesive force of the adhesive composition is increased, and heat resistance and mechanical strength of the adhesive layer formed from the adhesive composition are improved. Similarly, a holding power of peeling strength at a high temperature and a high humidity is also improved. This is believed to be due to the effect of suppression of moisture permeation achieved by the improvement in the cohesive force, and a lower percentage of water absorption than that of polyimide. This epoxy resin is not particularly limited as long as the epoxy resin has two or more epoxy groups per molecule. Examples of the epoxy resin include bisphenol A-type epoxy resins, bisphenol F-type epoxy resins, phenol novolac-type epoxy resins, cresol novolac-type epoxy resins, alicyclic epoxy resins, glycidyl ester-type epoxy resins, glycidyl amine-type epoxy resins, hydantoin-type epoxy resins, isocyanurate-type epoxy resins, acrylic acid-modified epoxy resins (epoxy acrylates), phosphorus-containing epoxy resins, halides thereof (such as brominated epoxy resins), and hydrogenated products thereof. Among these, novolac-type epoxy resins such as phenol novolac-type epoxy resins and cresol novolac-type epoxy resins are preferable from the viewpoint of heat resistance and low hygroscopicity. The epoxy resins exemplified above may be used alone or in combination of two or more resins.

Examples of commercially available phenol novolac-type epoxy resins include "jER152" and "jER154" (both of which are manufactured by Japan Epoxy Resins Co., Ltd.), "EPPN-201-L" (Nippon Kayaku Co., Ltd.), "EPICLON N-740" and "EPICLON N-770" (both of which are manufactured by DIC Corporation), and "Epotohto YDPN-638" (Nippon Steel & Sumikin Chemical Co., Ltd.).

Examples of commercially available cresol novolac-type epoxy resins include "EOCN-1020", "EOCN-102S", "EOCN-103S", and "EOCN-104S" (all of which are manufactured by Nippon Kayaku Co., Ltd.), and "EPICLON N-660, "EPICLON N-670" "EPICLON N-680" and "EPICLON N-695" (all of which are manufactured by DIC Corporation).

Among the novolac-type epoxy resins, epoxy resins that are solid at room temperature and have a softening point of 120° C. or lower are preferable from the viewpoint of improving heat resistance of the siloxane-modified polyimide.

The lower limit of the amount of epoxy resin blended is preferably 0.1 parts by mass, more preferably 0.5 parts by mass, and still more preferably 1 part by mass relative to 100 parts by mass of the siloxane-modified polyimide.
The upper limit of the amount of epoxy resin blended is preferably 50 parts by mass, more preferably 40 parts by mass, and still more preferably 20 parts by mass relative to 100 parts by mass of the siloxane-modified polyimide.
When the amount of epoxy resin blended is less than the lower limit, the siloxane-modified polyimide may not be sufficiently crosslinked, and heat resistance may not be sufficiently improved. When the amount of epoxy resin blended exceeds the upper limit, the ratio of an uncrosslinked epoxy resin increases, and heat resistance may rather decrease.

The adhesive composition may contain a curing agent for the epoxy resin.
(Curing Agent)

Publicly known curing agents can be used as the curing agent. Examples thereof include phenolic resins, polyamine curing agents, acid anhydride curing agents, imidazole curing agents, boron trifluoride-amine complex salts, aromatic diamine curing agents, carboxylic acid curing agents, and melamine resins. Among these, phenolic resins are preferable. The curing agents exemplified above may be used alone or in combination of two or more compounds.

The term "phenolic resins" covers xylene resins, resorcin resins, resorcin-modified phenolic resins, cresol-modified phenolic resins, alkylphenol-modified resins, and the like, besides phenol-formaldehyde resins. These phenolic resins can be synthesized from, for example, a phenol component and an aldehyde component.

Examples of the phenol component include, besides phenol, alkyl phenols such as cresol, xylenol, and isopropylphenol; divalent phenols such as resorcin; and vinyl phenols such as p-vinyl phenol. These phenol components may be used alone or in combination of two or more compounds.

Examples of the aldehyde component include, besides formaldehyde, aldehyde group-containing compounds such as acetaldehyde and furfural. These aldehyde components may be used alone or in combination of two or more compounds.

Examples of commercially available phenolic resins include

"Sumikanol 610" (Taoka Chemical Co., Ltd.);

"Tamanol 1010R", "Tamanol 100S", "Tamanol 510", "Tamanol 7509", and "Tamanol 7705" (all of which are manufactured by Arakawa Chemical Industries, Ltd.);

"Shonol CKM-1634", "Shonol CKM-1636", "Shonol CKM-1737", "Shonol CKM-1282", "Shonol CKM-904", "Shonol CKM-907", "Shonol CKM-908", "Shonol CKM-983", "Shonol CKM-2400", "Shonol CKM-941", "Shonol CKM-2103", "Shonol CKM-2432", "Shonol CKM-5254", "BKM-2620", "BRP-5904", "RM-0909", "BLS-2030", "BLS-3574", "BLS-3122", "BLS-362", "BLS-356", "BLS-3135", "CLS-3940", "CLS-3950", "BRS-324", "BRS-621", "BLL-3085", "BRL-113", "BRL-114", "BRL-117", "BRL-134", "BRL-274", "BRL-2584", "BRL-112A", "BRL-120Z", and "CKS-3898" (all of which are manufactured by Showa Denko K.K.);

"SP-460B", "SP103H", and "HRJ-1367" (all of which are manufactured by Schenectady Chemicals, Inc.);

"Resitop PL2211" (Gunei Chemical Industry Co., Ltd.);

"PR-HF-3", "PR-53194", and "PR-53195" (Sumitomo Bakelite Co., Ltd.);

"Nikanol PR1440", "Nikanol L", and "Nikanol P100" (Fudow Co., Ltd.); and

"Plyophen 5010", "Plyophen 503", and "TD-447" (DIC Corporation).

Examples of the polyamine curing agents include aliphatic amine curing agents such as diethylenetriamine and tetraethylenetetramine; alicyclic amine curing agents such as isophoronediamine; aromatic amine curing agents such as diaminodiphenylmethane and phenylenediamine; dicyandiamide etc.; and melamine resins.

Examples of the acid anhydride curing agents include phthalic anhydride, pyromellitic dianhydride, trimellitic anhydride, and hexahydrophthalic anhydride.

Examples of the imidazole curing agents include methylimidazole, phenylimidazole, 1-benzyl-2-phenylimidazole, 1-cyanoethyl-2-methylimidazole, and 1-cyanoethyl-2-undecylimidazole.

The amount of curing agent blended in the adhesive composition may be determined in accordance with the desired degree of curing, etc. The lower limit of the amount of curing agent blended may be 0 parts by mass, but is preferably 1 part by mass, more preferably 5 parts by mass, and still more preferably 10 parts by mass relative to 100 parts by mass of the epoxy resin. The upper limit of the amount of curing agent blended is preferably 100 parts by mass or less, and more preferably 90 parts by mass or less. When the amount of curing agent blended is less than the lower limit, heat resistance of the siloxane-modified polyimide may not be sufficiently improved. When the amount of curing agent blended exceeds the upper limit, the effect of improving heat resistance relative to the amount of curing agent blended is not expected, which may result in an increase in the cost.

<Inorganic Filler>

The inorganic filler improves peel strength and mechanical strength of an adhesive layer formed from the adhesive composition to a base film or the like.

Examples of the inorganic filler include talc, silica, alumina, silicon carbide, boron carbide, titanium carbide, tungsten carbide, silicon nitride, boron nitride, aluminum nitride, mica, potassium titanate, barium titanate, calcium carbonate, magnesium oxide, and zirconium oxide.

Examples of the form of the inorganic filler include a plate-like shape, a spherical shape, a needle-like shape, a fibrous shape, and an indeterminate shape. Among these, the form of the inorganic filler is preferably a plate-like shape.

In the case where the inorganic filler has a plate-like shape or the like, the lower limit of the aspect ratio of the inorganic filler is preferably 5, more preferably 8, and still more preferably 10. The upper limit of the aspect ratio of the inorganic filler is preferably 100, more preferably 75, and still more preferably 40.

When the aspect ratio of the inorganic filler is less than the lower limit, peel strength may not be sufficiently improved. When the aspect ratio of the inorganic filler exceeds the upper limit, the resulting adhesive layer may be weakened, and peel strength may decrease.

The lower limit of the average particle size of the inorganic filler is preferably 2 μm, and more preferably 3 μm. The upper limit of the average particle size is preferably 20 μm, more preferably 15 μm, and still more preferably 10 μm. When the average particle size is less than the lower limit, peel strength may not be sufficiently improved. When the average particle size exceeds the upper limit, the resulting adhesive layer may be weakened, and peel strength may decrease.

Herein, the term "average particle size" is a median size (d50) calculated from the cumulative distribution measured by a laser diffraction method, or the nominal value provided by the manufacturer.

The lower limit of the amount of inorganic filler blended is 10 parts by mass, and more preferably 20 parts by mass relative to 100 parts by mass of the siloxane-modified polyimide. The upper limit of the amount of inorganic filler blended is 70 parts by mass, and more preferably 50 parts by mass. When the amount blended is less than the lower limit, peel strength may not be sufficiently improved. When the amount blended exceeds the upper limit, the resulting adhesive layer may be weakened, and peel strength may decrease.

<Optional Component>

Examples of the optional components include a plasticizer, a flame retardant, a flame retardant auxiliary, a pigment, an antioxidant, a masking agent, a lubricant, a processing stabilizer, a foaming agent, and a coupling agent.

Examples of the plasticizer include phosphoric acid ester plasticizers such as trimethyl phosphate, triethyl phosphate, tributyl phosphate, tri-2-ethylhexyl phosphate, tributoxyethyl phosphate, trioleyl phosphate, triphenyl phosphate, tricresyl phosphate, trixylenyl phosphate, cresyl diphenyl phosphate, xylenyl diphenyl phosphate, and 2-ethylhexyl diphenyl phosphate;

polyester plasticizers such as 1,3-butylene glycol adipate;

phthalic acid ester plasticizers such as dimethyl phthalate, diethyl phthalate, dibutyl phthalate, diheptyl phthalate, di-2-ethylhexyl phthalate, di-n-octyl phthalate, diisodecyl phthalate, butyl benzyl phthalate, diisononyl phthalate, and ethyl phthalyl ethyl glycolate; and fatty acid ester plasticizers such as dimethyl adipate, diisobutyl adipate, dibutyl adipate, di-2-ethylhexyl adipate, diisodecyl adipate, dibutyl diglycol adipate, di-2-ethylhexyl azelate, dimethyl sebacate, dibutyl sebacate, di-2-ethylhexyl sebacate, and methyl-acetyl ricinoleate. These plasticizers may be used alone or in combination of two or more compounds.

The flame retardant provides flame retardancy to an adhesive etc. formed from the adhesive composition.

Examples of the flame retardant include chlorine-based flame retardants such as chlorinated paraffins, chlorinated polyethylene, chlorinated polyphenyl, and perchloropentacyclodecane;

bromine-based flame retardants such as ethylenebispentabromobenzene, ethylenebispentabromodiphenyl, tetrabromoethane, tetrabromobisphenol A, hexabromobenzene, decabromobiphenyl ether, tetrabromophthalic anhydride, polydibromophenylene oxide, hexabromocyclodecane, and ammonium bromide;

phosphoric acid esters and phosphorus compounds such as triallyl phosphate, alkylallyl phosphates, alkyl phosphates, dimethyl phosphonate, phosphorinate, halogenated phosphorinate esters, trimethyl phosphate, tributyl phosphate, trioctyl phosphate, tributoxyethyl phosphate, octyldiphenyl phosphate, tricresyl phosphate, cresylphenyl phosphate, triphenyl phosphate, tris(chloroethyl) phosphate, tris(2-chloropropyl) phosphate, tris(2,3-dichloropropyl) phosphate, tris(2,3-dibromopropyl) phosphate, tris(bromochloropropyl) phosphate, bis(2,3-dibromopropyl)2,3-dichloropropyl phosphate, bis(chloropropyl)monooctyl phosphate, polyphosphonate, polyphosphate, aromatic polyphosphate, dibromoneopentyl glycol, and aluminum tris(diethylphosphinate).

phosphonate polyols, phosphate polyols, and polyols containing a halogen atom or the like;

metal powders and inorganic compounds such as aluminum hydroxide, magnesium hydroxide, magnesium carbonate, antimony trioxide, antimony trichloride, zinc borate, antimony borate, boric acid, antimony molybdate, molybdenum oxide, phosphorus-nitrogen compounds, calcium-aluminum silicate, zirconium compounds, tin compounds, dawsonite, calcium aluminate hydrates, copper oxide, metal copper powder, calcium carbonate, and barium metaborate;

nitrogen compounds such as melamine cyanurate, triazine, isocyanurates, urea, guanidine; and other compounds such as silicone polymers, ferrocene, fumaric acid, and maleic acid. Among these, halogen-based flame retardants such as bromine-based flame retardants and chlorine-based flame retardants are preferable. The bromine-based flame retardants and the chlorine-based flame retardants may be used alone or in combination of two or more compounds.

The flame retardant auxiliary further improves flame retardancy of an adhesive layer formed from the adhesive composition. An example of the flame retardant auxiliary is antimony trioxide.

The pigment colors an adhesive layer formed from the adhesive composition. Various publicly known pigments can be used. An example thereof is titanium oxide.

The antioxidant prevents an adhesive layer formed from the adhesive composition from being oxidized. Various publicly known antioxidants can be used. Examples thereof include phenolic antioxidants.

In the case where optional components are blended with the adhesive composition of the present invention, the lower limit of the total content of the optional components is preferably 1 part by mass, and more preferably 2 parts by mass relative to 100 parts by mass of the polyimide resin. The upper limit of the total content is preferably 10 parts by mass, and more preferably 7 parts by mass.

<Preparation of Adhesive Composition>

The adhesive composition can be prepared by mixing a siloxane-modified polyimide, an epoxy resin, an inorganic filler, and, as required, a curing agent such as a phenolic resin, and other optional components. The adhesive composition is preferably prepared in a state where the above components are dissolved or dispersed in a solvent.

A solvent that uniformly dissolves or disperses the other components and does not react with the other components is suitably used as the solvent. Examples of such a solvent include solvents the same as those used in the preparation of the siloxane-modified polyimide. The solvents exemplified above may be used alone or in combination of two or more solvents.

[Bonding Film]

The bonding film is formed using the adhesive composition, and used for mounting an electronic component etc. on, for example, a base film or a land of a conductive pattern in a printed wiring board.

The bonding film can be formed by a publicly known method such as a melt-extrusion molding method, a solution casting method, or a calendering method.

This bonding film can be formed as a conductive film. In this case, a conductive substance such as a conductive particle is blended with the adhesive composition. Thus, the resulting film can be formed as a bonding film in which the conductive substance is dispersed. Examples of the conductive substance include metal particles, resin beads plated with a metal, carbon, carbon nanotubes, and graphite. The shape of the conductive substance is not limited to a spherical shape, but may be a shape with a high aspect ratio, such as a needle-like shape.

[Coverlay]

The coverlay protects a conductive pattern etc. in a printed wiring board. The coverlay includes a cover film and an adhesive layer formed from the adhesive composition.

The coverlay preferably has flame retardancy that satisfies the UL-94 VTM-0. When the adhesive layer has a certain degree of flame retardancy, the coverlay satisfies the flame retardancy of VTM-0. Consequently, flame retardancy can be provided to a printed wiring board that uses the coverlay. Herein, a flame retardant test of the UL-94 VTM-0 is performed using a standard sample described below.

Standard sample structure: laminate of polyimide film/adhesive layer/polyimide film Polyimide film: "Kapton 100H" manufactured by Du Pont-Toray Co., Ltd. (thickness: 25 µm)

Thickness of adhesive layer: 35 µm

Method for preparing standard sample: A polyimide film, an adhesive, and a polyimide film are stacked, and pressed under heating to bond the polyimide films. In this evaluation, the standard sample was prepared by performing thermocompression bonding at a pressing pressure of 3 MPa and a heating temperature of 180° C. for a pressing time of 45 minutes.

<Cover Film>

The cover film preferably has flexibility and insulating properties. Examples of a main component of the cover film include polyimide resins, epoxy resins, phenolic resins, acrylic resins, polyester resins, thermoplastic polyimide resins, polyethylene terephthalate resins, fluororesins, and liquid crystal polymers. In particular, polyimide resins are preferable in view of heat resistance.

The cover film may contain resins other than the main component, a weather-resistant agent, an antistatic agent, etc.

The lower limit of an average thickness of the cover film is not particularly limited, but is preferably 3 µm, and more preferably 10 µm. The upper limit of the average thickness of the cover film is not particularly limited, but is preferably 500 µm, and more preferably 150 µm. When the average thickness of the cover film is less than the lower limit, protection of the conductive pattern etc. may become insufficient. Furthermore, in the case where insulating properties are required for the cover film, the insulating properties may be insufficient.

When the average thickness of the cover film exceeds the upper limit, an additional effect of protecting the conductive pattern etc. may be reduced. Furthermore, in the case where flexibility is required for the cover film, the flexibility may be insufficient.

Herein, the term "average thickness" refers to an average of thicknesses measured at arbitrary ten points. Note that this definition applies also in the cases where the term "average thickness" is used for other members and the like described below.

<Adhesive Layer>

The adhesive layer is stacked on the cover film and has a function of bonding the cover film to a base film or the like of a printed wiring board. This adhesive layer is formed from the adhesive composition described above.

An adhesive layer can be formed on a cover film by applying the adhesive composition to a cover film, and then drying the adhesive composition. Alternatively, an adhesive layer can be formed by forming a film by the same method as that used for forming a bonding film, and then stacking the resulting film on a cover film.

[Copper-clad Laminate]

The copper-clad laminate is used for forming a printed wiring board. The copper-clad laminate includes a base film, an adhesive layer stacked on one or both surfaces of the base film, and a copper foil stacked on the adhesive layer. The copper-clad laminate may include a surface treatment layer stacked on the copper foil.

<Base Film>

The base film has insulating properties and preferably has flexibility. Examples of a main component of the base film include polyimide resins, polyethylene terephthalate resins, fluororesins, and liquid crystal polymers. Polyimide resins are preferable in view of flexibility and strength.

Base Film

The lower limit of the average thickness of the base film is not particularly limited, but is preferably 3 µm, more preferably 5 µm, and still more preferably 10 µm. The upper limit of the average thickness of the base film is not particularly limited, but is preferably 200 µm, more preferably 150 µm, and still more preferably 100 µm. When the average thickness of the base film is less than the lower limit, insulating properties and mechanical strength may become insufficient. When the average thickness of the base film exceeds the upper limit, the thickness of the resulting printed wiring board may become excessively large. Furthermore, in the case where flexibility is required for the base film, the flexibility may be insufficient.

<Adhesive Layer>

The adhesive layer is stacked on the base film and has a function of bonding a copper foil to this base film. This adhesive layer is formed from the adhesive composition described above. The lower limit of the average thickness of the adhesive layer is not particularly limited, but is preferably 5 µm or more and 100 µm or less, and more preferably 10 µm or more and 75 µm or less. When the average thickness of the adhesive layer is less than 5 µm or more than 100 µm, it may be difficult to form a coating film. Furthermore, the larger the average thickness of the adhesive layer, the larger the warpage during application and drying of an adhesive tends to be, and the larger the amount of solvent remaining in the adhesive layer. Therefore, the solvent and the like are vaporized during reflow and form voids, which may often cause a decrease in peel strength and appearance defects. The adhesive layer needs to have such a thickness that a conductor is embedded in the adhesive layer. Accordingly, when the conductor has a large thickness, it is necessary that the adhesive layer also have a large thickness. Since the adhesive composition of the present invention is good in terms of warpage and heat resistance compared to existing adhesive compositions, the thickness of the resulting adhesive layer can be increased. Thus, the adhesive composition of the present invention can be used for a thick conductor in which a large current needs to flow, for example, for a conductor installed in a car.

An adhesive layer can be formed on a base film by applying the adhesive composition to a base film, and then drying the adhesive composition. Alternatively, an adhesive layer can be formed by forming a film by the same method as that used for forming a bonding film, and then stacking the resulting film on a baser film.

<Copper Foil>

The copper foil forms a conductor pattern of a printed wiring board as a result of being subjected to etching or the like. The copper foil may further have a surface treatment layer. The lower limit of the average thickness of the copper foil is not particularly limited, but is preferably 5 µm, and more preferably 10 µm. The upper limit of the average thickness of the copper foil is not particularly limited, but is preferably 100 µm, and more preferably 75 µm. In particular, in the case where a large current needs to flow, for example, in an installation in a car, the average thickness of the copper foil is preferably 50 µm or more and 100 µm or less. When the average thickness is less than the lower limit, electrical conduction may become insufficient. When the average thickness exceeds the upper limit, flexibility may decrease, and such a large thickness may be contrary to the requirements for a reduction in the thickness.

<Surface Treatment Layer>

The surface treatment layer prevents a conductive component from leaking from the copper foil or prevents components (such as oxygen and sulfur) reactive with the conductive component from diffusing in the copper foil. That is, the surface treatment layer also has a function of improving oil resistance. The surface treatment layer covers a surface of the copper foil and may continuously cover side faces of the copper foil. The material of the surface treatment layer is not particularly limited as long as the material can prevent a conductive component from leaking from the copper foil or prevent a reactive component from diffusing in the copper foil. Examples of the material include metals, resins, ceramics, and mixtures thereof. In particular, the material of the surface treatment layer is preferably Ni, Sn, or Al.

A surface treatment layer composed of Ni or Sn can be formed by a plating process, and a surface treatment layer composed of Al can be formed by vapor deposition. The surface treatment layer may be formed by a chemical vapor deposition (CVD) method such as thermal CVD or plasma CVD; a physical vapor deposition method such as sputtering or ion plating; or a thermal spraying method such as oxygen fuel spraying or electric spraying. In particular, the surface treatment layer is preferably formed by a plating process. By forming the surface treatment layer by a plating process, it is possible to form, at a low cost, a surface treatment layer which has an appropriate thickness and which can effectively prevent a conductive component from leaking from a copper foil and prevent a reactive component from diffusing in a copper foil. From the standpoint described above, the surface treatment layer is more preferably composed of Ni or Sn, which can be easily formed by a plating process. In particular, Ni, which has a good heat resistance, is still more preferable because a printed wiring board is usually produced through a high-temperature step such as a step of soldering in a reflow furnace, and the printed wiring board is assumed to be used at a high temperature of 150° C.

The lower limit of the average thickness of the surface treatment layer is not particularly limited, but is preferably 0.01 µm, more preferably 0.03 µm, and still more preferably 0.05 µm. The upper limit of the average thickness of the surface treatment layer is not particularly limited, but is preferably 6.0 µm, more preferably 1.0 µm, and still more preferably 0.5 µm. When the average thickness of the surface treatment layer is less than the lower limit, leakage of a conductive component such as copper and diffusion of a reactive component in a copper foil may not be sufficiently prevented. When the average thickness exceeds the upper limit, additional effects of preventing a conductive component from leaking from a copper foil and preventing a component that is reactive with copper from diffusing in a copper foil may not be expected relative to an increase in the cost due to the increase in the thickness.

Instead of forming the surface treatment layer, a surface of a copper foil may be subjected to a rustproofing treatment with Copperbrite. Copperbrite is obtained by dissolving a water-soluble polymer such as a polyoxyethylene alkyl ether in isopropyl alcohol and hydroxybutyric acid. It is believed that, as a result of this rustproofing treatment, a water-soluble polymer such as a polyoxyethylene alkyl ether adheres to the surface of a copper foil. When an existing adhesive is applied onto copper to which a polyoxyethylene alkyl ether or the like adheres, the heat resistance decreases. In contrast, an adhesive layer formed from the adhesive composition described above has a good heat resistance even in the case where a copper foil that has been subjected to a rustproofing treatment is used.

[Printed Wiring Board]

A printed wiring board 1 in FIG. 1 is formed as a flexible printed wiring board having flexibility. The printed wiring board 1 includes a base film 2, a conductive pattern 3, and a coverlay 4.

[Base Film]

The base film 2 has insulating properties and flexibility. Examples of a main component of the base film 2 include polyimide resins, polyethylene terephthalate resins, fluororesins, and liquid crystal polymers. Polyimide resins are preferable in view of flexibility and strength. The base film 2 may contain resins other than the main component, a weather-resistant agent, an antistatic agent, etc.

The average thickness of the base film 2 is not particularly limited but is, for example, 5 µm or more and 100 µm or less for the same reasons as those for the base film of the copper-clad laminate.

[Conductive Pattern]

The conductive pattern 3 is stacked on a front surface side of the base film 2. The conductive pattern 3 includes a base conductor 30. The conductive pattern 3 may further include a surface treatment layer 31.

<Base Conductor>

The base conductor 30 is formed by, for example, etching a metal foil composed of copper, aluminum, or the like to have a desired pattern. The lower limit of the average thickness of the base conductor 30 is not particularly limited, but is preferably 2 μm, and more preferably 5 μm. The upper limit of the average thickness of the base conductor 30 is not particularly limited, but is preferably 100 μm, and more preferably 75 μm. When the average thickness is less than the lower limit, electrical conduction may become insufficient. When the average thickness exceeds the upper limit, flexibility may decrease, and such a large thickness may be contrary to the requirements for a reduction in the thickness.

<Surface Treatment Layer>

The surface treatment layer 31 prevents a conductive component such as copper from leaking from the base conductor 30 or prevents components, such as oxygen and sulfur, reactive with the conductive component from diffusing in the base conductor 30. That is, the surface treatment layer 31 also has a function of improving oil resistance. This surface treatment layer 31 is similar to the surface treatment layer of the copper-clad laminate, and thus an overlapping description is omitted.

The coverlay 4 protects the conductive pattern 3. The coverlay 4 includes a cover film 40 and an adhesive layer 41.

<Cover Film>

The cover film 40 has flexibility and preferably has insulating properties. Examples of a main component of the cover film 40 include polyimide resins, epoxy resins, phenolic resins, acrylic resins, polyester resins, thermoplastic polyimide resins, polyethylene terephthalate resins, fluororesins, and liquid crystal polymers. In particular, polyimide resins are preferable in view of heat resistance. The cover film 40 may contain resins other than the main component, a weather-resistant agent, an antistatic agent, etc.

The lower limit of the average thickness of the cover film 40 is not particularly limited, but is preferably 3 μm, and more preferably 10 μm. The upper limit of the average thickness of the cover film 40 is not particularly limited, but is preferably 500 μm, and more preferably 150 μm. When the average thickness of the cover film 40 is less than the lower limit, insulating properties may become insufficient. When the average thickness of the cover film 40 exceeds the upper limit, flexibility of the printed wiring board 1 may decrease.

<Adhesive Layer>

The adhesive layer 41 is stacked on the cover film 40 and has a function of bonding the cover film 40 to the base film 2 and the conductive pattern 3. The adhesive layer 41 is formed from the adhesive composition described above.

The printed wiring board 1 preferably has a peel strength between the cover film 40 of the coverlay 4 and the conductive pattern 3 of 5 N/cm or more after the printed wiring board 1 is allowed to stand in air at 150° C. for 1,000 hours. When the peel strength is in this range, the printed wiring board 1 can be suitably used even in a high-temperature environment such as in a periphery of an automobile engine. The upper limit of the peel strength is not particularly limited, but higher peel strength is better.

The printed wiring board 1 preferably has a peel strength between the cover film 40 of the coverlay 4 and the conductive pattern 3 of 2 N/cm or more after the printed wiring board 1 is immersed in an ATF oil at 150° C. for 1,000 hours. When the peel strength is in this range, the printed wiring board can be suitably used even in an environment in which an ATF oil or the like is dispersed and heat resistance and oil resistance are required, such as in a periphery of an automobile engine. The upper limit of the peel strength is not particularly limited, but higher peel strength is better.

The printed wiring board 1 preferably has a peel strength between the cover film 40 of the coverlay 4 and the conductive pattern 3 of 4 N/cm or more after the printed wiring board 1 is allowed to stand in air at 85° C. and 85% for 1,000 hours. When the printed wiring board 1 has this characteristic, the printed wiring board 1 can be suitably used even in a high-temperature high-humidity environment.

The printed wiring board 1 preferably has a solder heat resistance at 340° C. for 60 seconds. When the printed wiring board 1 has this characteristic, the printed wiring board 1 can be suitably used in automobile applications, for which high solder heat resistance is required.

[Method for Producing Printed Wiring Board]

Next, a method for producing the printed wiring board 1 will be described with reference to FIGS. 2A to 2D. The method for producing the printed wiring board 1 includes a step of preparing a base film 2 having insulating properties and flexibility and forming a copper conductive pattern 3 stacked on a front surface side of the base film 2, and a step of stacking a coverlay 4 on the front surface side of the base film 2. In the present embodiment, a description will be made of a case where the surface treatment layer 31 is formed by Ni plating.

<Conductive Pattern-forming Step>

Figure 2A:
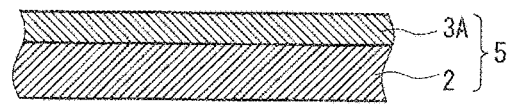
FIG. 2A is a schematic cross-sectional view illustrating a method for producing the flexible printed wiring board in FIG. 1.
Figure 2B:
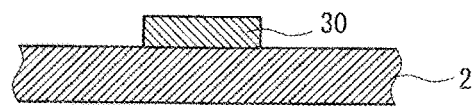
FIG. 2B is a schematic cross-sectional view illustrating the method for producing the flexible printed wiring board in FIG. 1.
Figure 2C:
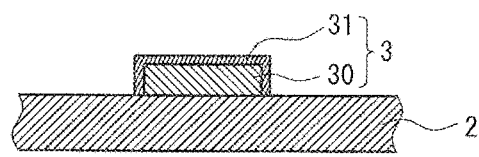
FIG. 2C is a schematic cross-sectional view illustrating the method for producing the flexible printed wiring board in FIG. 1.

As illustrated in FIGS. 2A to 2C, the step of forming a conductive pattern is performed by using a copper-clad laminate 5 in which a copper foil (copper film) 3A is stacked on a base film 2, patterning the copper foil 3A to form a base conductor 30 having a predetermined planer shape, and then forming a surface treatment layer 31 on the base conductor 30.

(Copper-clad Laminate)

The copper-clad laminate 5 illustrated in FIG. 2A includes a base film 2 and a copper foil 3A stacked on the base film 2. Examples of the method for stacking the copper foil 3A on the base film 2 include a bonding method in which the copper foil 3A is bonded to the base film 2 with an adhesive; a casting method in which a resin composition which is the material of the base film 2 is applied onto the copper foil 3A; a sputtering/plating method in which a thin conductive layer (seed layer) having a thickness of several nanometers is formed on the base film 2 by sputtering, a vapor deposition method, or the like, and a metal layer is then formed on the seed layer by electrolytic plating; and a lamination method in which a metal foil is bonded by heat pressing.

(Patterning)

As illustrated in FIG. 2B, patterning of the copper foil 3A can be performed by a publicly known method, for example, photoetching. The photoetching is performed by forming a resist film having a predetermined pattern on a surface of the copper foil 3A, subsequently dissolving the copper foil 3A exposed from the resist film with an etchant, and removing the resist film.

(Formation of Surface Treatment Layer)

As illustrated in FIG. 2C, the surface treatment layer 31 is formed by, for example, plating the base conductor 30 with Ni. Electrolytic plating and electroless plating can be used as this plating process. By using electroless plating, the thickness of the surface treatment layer 31 can be made uniform easily and reliably. On the other hand, by using electrolytic plating, a dense surface treatment layer 31 can be formed, and the surface treatment layer 31 can be easily provided on side faces of the base conductor 30. In particular, it is preferable to use electroless plating, by which a surface treatment layer 31 having a small and uniform thickness can be formed using inexpensive equipment.

<Coverlay-Stacking Step>

Figure 2D:
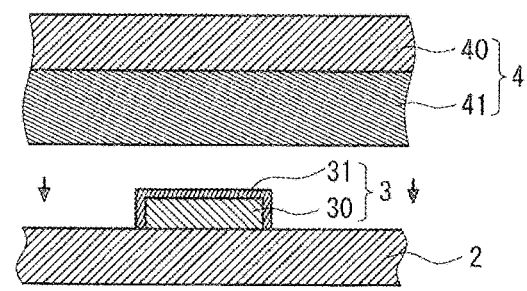
FIG. 2D is a schematic cross-sectional view illustrating the method for producing the flexible printed wiring board in FIG. 1.

As illustrated in FIG. 2D, in the step of stacking a coverlay, first, a coverlay 4 in which an adhesive layer 41 is stacked on a surface of a cover film 40 is placed so that the adhesive layer 41 side faces the surface treatment layer 31 and the base film 2. A part of the conductive pattern 3, the part corresponding to a land, is exposed by not placing the coverlay 4 on the part or by forming a cut portion in the coverlay 4 at a position corresponding to the land. Subsequently, the coverlay 4 is heated together with the base film 2 and the conductive pattern 3 to cure the adhesive layer 41. In this case, the heating temperature is preferably 120° C. or higher and 200° C. or lower, and the heating time is preferably 1 minute or more and 60 minutes or less. By controlling the heating temperature and the heating time to the above ranges, adhesive properties of the adhesive layer 41 can be effectively exhibited, and deterioration of the base film 2 etc. can be suppressed. Examples of the heating method include, but are not particularly limited to, heat pressing and a heating method using heating means such as an oven or a hot plate. Heating under pressure by heat pressing is preferable.

[Advantages]

The adhesive composition contains a siloxane-modified polyimide that includes the structural unit containing a diamine siloxane residue and represented by formula (1) above and the structural unit containing an aromatic diamine residue and represented by formula (2) above. In this siloxane-modified polyimide, the ratio of the structural unit represented by formula (1) above is 0.35 or more and 0.75 or less, and the ratio of the structural unit represented by formula (2) above is 0.25 or more and 0.65 or less. The number of siloxane residues in the molecule is substantially the same as the number of aromatic diamine residues. Thus, the siloxane-modified polyimide used in the adhesive composition does not contain a siloxane residue, which may decrease short-term heat resistance, in an excessive amount. As a result, the adhesive composition can suppress a decrease in short-term heat resistance of an adhesive layer.

The adhesive composition contains an epoxy resin. The epoxy resin is believed to act as a crosslinking agent of the siloxane-modified polyimide. Accordingly, it is believed that the siloxane-modified polyimide is crosslinked by the epoxy resin, thereby improving the heat resistance and strength of an adhesive layer formed using the adhesive composition.

Furthermore, by controlling the weight-average molecular weight (Mw) of the siloxane-modified polyimide in the above range, in particular, by controlling the weight-average molecular weight (Mw) to 150,000 or less, aggregation of the siloxane-modified polyimide can be suppressed. Therefore, since the adhesive composition contains such a siloxane-modified polyimide, a decrease in peel strength due to aggregation of the siloxane-modified polyimide can be suppressed. As a result, the adhesive composition can improve the heat resistance of an adhesive layer formed using the adhesive composition.

In addition, since the adhesive composition contains an inorganic filler, mechanical strength of the adhesive composition can be improved, and peel strength thereof can be improved.

Accordingly, since the adhesive composition contains a siloxane-modified polyimide that does not contain a siloxane residue in an excessive amount and that has a weight-average molecular weight (Mw) in the above range, and contains an epoxy resin and an inorganic filler, not only short-term heat resistance of an adhesive layer formed using the adhesive composition but also heat resistance thereof can be improved. Therefore, the adhesive composition for a printed wiring board can improve the heat resistance of a printed wiring board.

Since the bonding film is formed from the adhesive composition for a printed wiring board, the heat resistance of a printed circuit board that uses the bonding film can be improved.

Since the coverlay includes an adhesive layer formed from the adhesive composition for a printed wiring board, the heat resistance of a printed wiring board that uses the coverlay can be improved.

Since the printed wiring board includes the coverlay, the printed wiring board has a good heat resistance.

[Other Embodiments]

It is to be understood that the embodiments disclosed herein are only illustrative and are not restrictive in all respects. The scope of the present invention is not limited to the configurations of the above embodiments but is defined by the claims described below. It is intended that the scope of the present invention includes equivalents of the claims and all modifications within the scope of the claims.

In the above embodiments, the printed wiring board has been described using a flexible printed wiring board as an example. However, the printed wiring board does not necessarily have flexibility.

The printed wiring board is not limited to a single-sided printed wiring board in which a conductive pattern is formed on one surface thereof. Alternatively, the printed wiring board may be a double-sided printed wiring board in which conductive patterns are formed on both surfaces thereof. Alternatively, the printed wiring board may be a multilayer printed wiring board on which a plurality of conductive pattern layers are formed.

In the printed wiring board, the surface treatment layer of the conductor pattern or the like may be omitted.

EXAMPLES

The present invention will be described in more detail using Examples. However, the present invention is not limited to these Examples.

[Synthesis of Siloxane-modified Polyimide]

Siloxane-modified polyimides (A1) to (A11) were synthesized by the methods described below. The types of acid anhydride component and diamine component and the compounding ratios are as shown in Table I.

Synthesis Example 1

Synthesis of siloxane-modified polyimide (A1)

To a 1:1 mixed solvent (mass ratio) of N-methyl-2-pyrrolidone and xylene serving as an organic solvent, 3,3',4,4'-biphenyltetracarboxylic dianhydride (BPDA) serving as an acid anhydride, 2,2-bis(4-aminophenoxy phenyl)propane (BAPP) serving as an aromatic diamine, and a compound (PSA) represented by formula (9) above and having an amine equivalent of 420 g/eq, the compound serving as a siloxane diamine, were added in a molar ratio of 1.0:0.4:0.6 to prepare a reaction solution. The amount of the organic solvent blended in the reaction solution was determined such that the content of a siloxane-modified polyimide precursor in the resulting siloxane-modified polyimide precursor solution became 30% by mass.

The reaction solution was allowed to react at a temperature of 180° C. for 16 hours to imidize the siloxane-modified polyimide precursor. A polymer solution containing a siloxane-modified polyimide (A1) was obtained.

The siloxane-modified polyimide in the siloxane-modified polyimide solution had a weight-average molecular weight (Mw) of 92,000. The definition and the measuring method of the weight-average molecular weight (Mw) were as described above.

Synthesis Example 2

Synthesis of siloxane-modified polyimide (A2)

A polymer solution containing a siloxane-modified polyimide (A2) was obtained as in Synthesis Example 1 except that the reaction solution was allowed to react at a temperature of 180° C. for 14 hours to imidize the polyamic acid. The siloxane-modified polyimide (A2) had a weight-average molecular weight (Mw) of 75,000.

Synthesis Example 3

Synthesis of siloxane-modified polyimide (A3)

To a 1:1 mixed solvent (mass ratio) of N-methyl-2-pyrrolidone and xylene serving as an organic solvent, 3,3',4,4'-biphenyltetracarboxylic dianhydride (BPDA) serving as an acid anhydride, 2,2-bis(4-aminophenoxy phenyl)propane (BAPP) serving as an aromatic diamine, and a compound (PSA) represented by formula (9) above and having an amine equivalent of 420 g/eq, the compound serving as a siloxane diamine, were added in a molar ratio of 1.0:0.6:0.4 to prepare a reaction solution. The amount of the organic solvent blended in the reaction solution was determined such that the content of a siloxane-modified polyimide precursor became 30% by mass.

The reaction solution was allowed to react at a temperature of 180° C. for 10 hours to imidize the siloxane-modified polyimide precursor. A polymer solution containing a siloxane-modified polyimide (A3) was obtained.
The siloxane-modified polyimide (A3) had a weight-average molecular weight (Mw) of 42,000.

Synthesis Example 4

Synthesis of siloxane-modified polyimide (A4)

To a 1:1 mixed solvent (mass ratio) of N-methyl-2-pyrrolidone and xylene serving as an organic solvent, 3,3',4,4'-biphenyltetracarboxylic dianhydride (BPDA) serving as an acid anhydride, 2,2-bis(4-aminophenoxy phenyl)propane (BAPP) serving as an aromatic diamine, and a compound (PSA) represented by formula (9) above and having an amine equivalent of 420 g/eq, the compound serving as a siloxane diamine, were added in a molar ratio of 1.0:0.5:0.5 to prepare a reaction solution. The amount of the organic solvent blended in the reaction solution was determined such that the content of a siloxane-modified polyimide precursor in the resulting siloxane-modified polyimide precursor solution became 30% by mass.

The reaction solution was allowed to react at a temperature of 180° C. for 13 hours to imidize the siloxane-modified polyimide precursor. A polymer solution containing a siloxane-modified polyimide (A4) was obtained.

The siloxane-modified polyimide (A4) had a weight-average molecular weight (Mw) of 64,000.

Synthesis Example 5

Synthesis of siloxane-modified polyimide (A5)

To a 1:1 mixed solvent (mass ratio) of N-methyl-2-pyrrolidone and xylene serving as an organic solvent, 4,4'-oxydiphthalic anhydride (ODPA) serving as an acid anhydride, 2,2-bis(4-aminophenoxy phenyl)propane (BAPP) serving as an aromatic diamine, and a compound (PSA) represented by formula (9) above and having an amine equivalent of 420 g/eq, the compound serving as a siloxane diamine, were added in a molar ratio of 1.0:0.5:0.5 to prepare a reaction solution. The amount of the organic solvent blended in the reaction solution was determined such that the content of a siloxane-modified polyimide precursor became 30% by mass.

The reaction solution was allowed to react at a temperature of 180° C. for 10 hours to imidize the siloxane-modified polyimide precursor. A polymer solution containing a siloxane-modified polyimide (A5) was obtained.

The siloxane-modified polyimide (A5) had a weight-average molecular weight (Mw) of 45,000.

Synthesis Example 6

Synthesis of siloxane-modified polyimide (A6)

To a 1:1 mixed solvent (mass ratio) of N-methyl-2-pyrrolidone and xylene serving as an organic solvent, 3,3',4,4'-biphenyltetracarboxylic dianhydride (BPDA) serving as an acid anhydride, 2,2-bis(4-aminophenoxy phenyl)propane (BAPP) serving as an aromatic diamine, and a compound (PSA) represented by formula (9) above and having an amine equivalent of 420 g/eq, the compound serving as a siloxane diamine, were added in a molar ratio of 1.0:0.4:0.6 to prepare a reaction solution. The amount of the organic solvent blended in the reaction solution was determined such that the content of a siloxane-modified polyimide precursor became 30% by mass.

The reaction solution was allowed to react at a temperature of 180° C. for 12 hours to obtain a polymer solution containing a siloxane-modified polyimide precursor. The siloxane-modified polyimide (A6) had a weight-average molecular weight (Mw) of 56,000.

Synthesis Example 7

Synthesis of siloxane-modified polyimide (A7)

To a 1:1 mixed solvent (mass ratio) of N-methyl-2-pyrrolidone and xylene serving as an organic solvent, 3,3',4,4'-biphenyltetracarboxylic dianhydride (BPDA) serving as an acid anhydride, 2,2-bis(4-aminophenoxy phenyl)propane (BAPP) serving as an aromatic diamine, and a compound (PSA) represented by formula (9) above and having an amine equivalent of 420 g/eq, the compound serving as a siloxane diamine, were added in a molar ratio of 1.0:0.3:0.7 to prepare a reaction solution. The amount of the organic solvent blended in the reaction solution was determined such that the content of a polyamic acid in the resulting siloxane-modified polyimide precursor solution became 30% by mass.

The reaction solution was allowed to react at a temperature of 180° C. for 16 hours to obtain a polymer solution containing a siloxane-modified polyimide. The siloxane-modified polyimide (A7) had a weight-average molecular weight (Mw) of 77,000.

Synthesis Example 8

Synthesis of siloxane-modified polyimide (A8)

To a 1:1 mixed solvent (mass ratio) of N-methyl-2-pyrrolidone and xylene serving as an organic solvent, 3,3',4,4'-biphenyltetracarboxylic dianhydride (BPDA) serving as an acid anhydride, 2,2-bis(4-aminophenoxy phenyl)propane (BAPP) serving as an aromatic diamine, and a compound (PSA) represented by formula (9) above and having an amine equivalent of 420 g/eq, the compound serving as a siloxane diamine, were added in a molar ratio of 1.0:0.4:0.6 to prepare a reaction solution. The amount of the organic solvent blended in the reaction solution was determined such that the content of a siloxane-modified polyimide precursor became 30% by mass.

The reaction solution was allowed to react at a temperature of 180° C. for 8 hours to obtain a polymer solution containing a siloxane-modified polyimide. The siloxane-modified polyimide (A8) had a weight-average molecular weight (Mw) of 29,000.

Synthesis Example 9

Synthesis of siloxane-modified polyimide (A9)

To a 1:1 mixed solvent (mass ratio) of N-methyl-2-pyrrolidone and xylene serving as an organic solvent, 3,3',4,4'-biphenyltetracarboxylic dianhydride (BPDA) serving as an acid anhydride, 2,2-bis(4-aminophenoxy phenyl)propane (BAPP) serving as an aromatic diamine, and a compound (PSA) represented by formula (9) above and having an amine equivalent of 420 g/eq, the compound serving as a siloxane diamine, were added in a molar ratio of 1.0:0.25:0.75 to prepare a reaction solution. The amount of the organic solvent blended in the reaction solution was determined such that the content of a polyamic acid in the resulting siloxane-modified polyimide precursor solution became 30% by mass.

The reaction solution was allowed to react at a temperature of 180° C. for 16 hours to obtain a polymer solution containing a siloxane-modified polyimide. The siloxane-modified polyimide (A9) had a weight-average molecular weight (Mw) of 78,000.

Synthesis Example 10

Synthesis of siloxane-modified polyimide (A10)

To a 1:1 mixed solvent (mass ratio) of N-methyl-2-pyrrolidone and xylene serving as an organic solvent, 3,3',4,4'-biphenyltetracarboxylic dianhydride (BPDA) serving as an acid anhydride, 2,2-bis(4-aminophenoxy phenyl)propane (BAPP) serving as an aromatic diamine, and a compound (PSA) represented by formula (9) above and having an amine equivalent of 420 g/eq, the compound serving as a siloxane diamine, were added in a molar ratio of 1.0:0.2:0.8 to prepare a reaction solution. The amount of the organic solvent blended in the reaction solution was determined such that the content of a polyamic acid in the resulting siloxane-modified polyimide precursor solution became 30% by mass.

The reaction solution was allowed to react at a temperature of 180° C. for 16 hours to obtain a polymer solution containing a siloxane-modified polyimide. The siloxane-modified polyimide (A10) had a weight-average molecular weight (Mw) of 77,000.

Synthesis Example 11

Synthesis of siloxane-modified polyimide (A11)

To a 1:1 mixed solvent (mass ratio) of N-methyl-2-pyrrolidone and xylene serving as an organic solvent, 3,3',4,4'-biphenyltetracarboxylic dianhydride (BPDA) serving as an acid anhydride, 2,2-bis(4-aminophenoxy phenyl)propane (BAPP) serving as an aromatic diamine, and a compound (PSA) represented by formula (9) above and having an amine equivalent of 420 g/eq, the compound serving as a siloxane diamine, were added in a molar ratio of 1.0:0.1:0.9 to prepare a reaction solution. The amount of the organic solvent blended in the reaction solution was determined such that the content of a polyamic acid in the resulting siloxane-modified polyimide precursor solution became 30% by mass.

The reaction solution was allowed to react at a temperature of 180° C. for 10 hours to obtain a polymer solution containing a siloxane-modified polyimide. The siloxane-modified polyimide (A11) had a weight-average molecular weight (Mw) of 37,000.

TABLE I

| Modified polyimide | Acid anhydride component Component/ Blending molar ratio | Diamine component | | Weight-average molecular weight (MW) |
|---|---|---|---|---|
| | | Aromatic diamine/ Blending molar ratio | Siloxane diamine/ Blending molar ratio | |
| A1 | BPDA/1.00 | BAPP/0.4 | PSA/0.6 | 92,000 |
| A2 | BPDA/1.00 | BAPP/0.4 | PSA/0.6 | 75,000 |
| A3 | BPDA/1.00 | BAPP/0.6 | PSA/0.4 | 42,000 |
| A4 | BPDA/1.00 | BAPP/0.5 | PSA/0.5 | 64,000 |
| A5 | ODPA/1.00 | BAPP/0.5 | PSA/0.5 | 45,000 |
| A6 | BPDA/1.00 | BAPP/0.4 | PSA/0.6 | 56,000 |
| A7 | BPDA/1.00 | BAPP/0.3 | PSA/0.7 | 77,000 |
| A8 | BPDA/1.00 | BAPP/0.4 | PSA/0.6 | 29,000 |
| A9 | BPDA/1.00 | BAPP/0.3 | PSA/0.7 | 78,000 |
| A10 | BPDA/1.00 | BAPP/0.2 | PSA/0.8 | 77,000 |
| A11 | BPDA/1.00 | BAPP/0.1 | PSA/0.9 | 37,000 |

<Preparation of Adhesive Composition>

Example 1

One hundred parts by mass (an amount corresponding to the solid content) of the siloxane-modified polyimide (A1) dissolved in a 1:1 mixed solvent (mass ratio) of N-methyl-2-pyrrolidone and xylene serving as a solvent, 45 parts by mass of talc ("MICRO ACE K1" manufactured by Nippon Talc Co., Ltd.: average particle size 8 pin) serving as an inorganic filler, 4 parts by mass of an epoxy resin ("EPICLON N695" manufactured by DIC Corporation (softening point 90° C. to 100° C., epoxy equivalent 209 to 219 g/eq)), and 3 parts by mass of a phenolic resin ("GPH-65" manufactured by Nippon Kayaku Co., Ltd.) serving as a curing agent were mixed to obtain an adhesive composition.

Examples 2 to 7 and Comparative Examples 1 to 10

Adhesive compositions were prepared by conducting the operation as in Example 1 except that the types and the contents of components shown in Table II below were used. Note that the symbol "-" in Table II shows that the corresponding component was not incorporated.

TABLE II

| | Composition (parts by mass) | | | |
|---|---|---|---|---|
| | Modified polyimide Type/Amount blended | Inorganic filler | Epoxy resin | Curing agent (Phenolic resin) |
| Example 1 | A1 | 100 | 45 | 4 | 3 |
| Example 2 | A2 | 100 | 45 | 8 | 6 |
| Example 3 | A2 | 100 | 45 | 4 | 3 |
| Example 4 | A6 | 100 | 45 | 4 | 3 |
| Example 5 | A2 | 100 | 45 | 1.3 | 1 |
| Example 6 | A7 | 100 | 45 | 4 | 3 |
| Example 7 | A9 | 100 | 45 | 4 | 3 |
| Comparative Example 1 | A1 | 100 | 45 | — | — |
| Comparative Example 2 | A3 | 100 | 45 | — | — |
| Comparative Example 3 | A4 | 100 | 45 | — | — |
| Comparative Example 4 | A5 | 100 | 45 | — | — |
| Comparative Example 5 | A6 | 100 | 15 | — | — |
| Comparative Example 6 | A7 | 100 | 45 | — | — |
| Comparative Example 7 | A8 | 100 | 45 | — | — |
| Comparative Example 8 | A1 | 100 | — | — | — |
| Comparative Example 9 | A10 | 100 | 45 | 4 | 3 |
| Comparative Example 10 | A11 | 100 | 45 | 4 | 3 |

<Preparation of Evaluation Samples>

Figure 3:
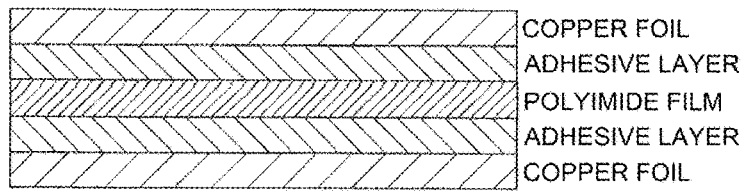
FIG. 3 is a schematic cross-sectional view of Evaluation sample 1 used in Examples of the present invention.
Figure 4:
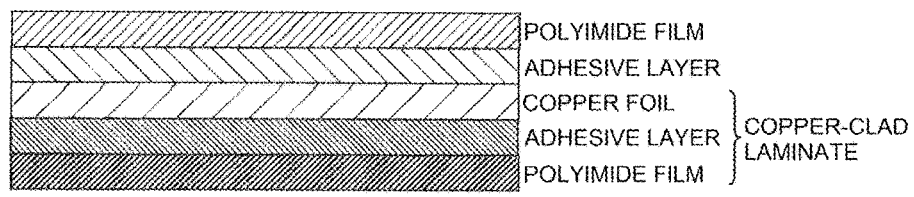
FIG. 4 is a schematic cross-sectional view of Evaluation sample 2 used in Examples of the present invention.
Figure 5:
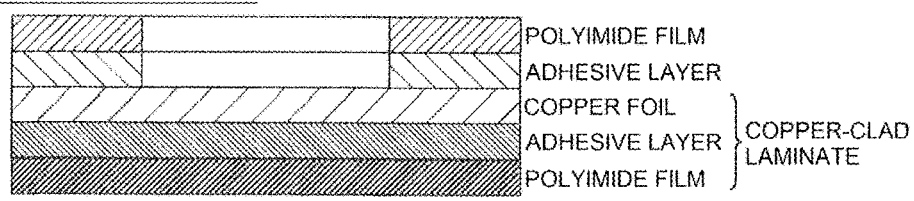
FIG. 5 is a schematic cross-sectional view of Evaluation sample 4 used in Examples of the present invention.

A double sided copper-clad laminate (Evaluation sample 1) illustrated in FIG. 3, a copper-clad laminate with a coverlay (Evaluation sample 2) illustrated in FIG. 4, a copper-clad laminate with a coverlay (Evaluation sample 3), the copper-clad laminate being prepared by performing a nickel plating process on a copper foil of Evaluation sample 2, and a single-sided copper-clad laminate with a hole (Evaluation sample 4) illustrated in FIG. 5 were prepared as evaluation samples in accordance with the methods described below.

(Evaluation Sample 1)

Evaluation sample 1 illustrated in FIG. 3 was prepared by thermocompression-bonding a polyimide film ("Kapton 100H" manufactured by Du Pont-Toray Co., Ltd.; thickness 25 μm) with two copper foils (thickness 35 μm) to which an adhesive composition was applied so as to have a thickness of 45 μm to 55 μm at a pressing pressure of 3 MPa and a heating temperature of 180° C. for a pressing time of 45 minutes. Copper foils subjected to a rustproofing treatment with Copperbrite were used as the copper foils. This rustproofing treatment was performed using a rustproofing solution in which a polyoxyethylene alkyl ether, which is a water-soluble polymer, was dissolved in isopropyl alcohol and hydroxybutyric acid. The same adhesive composition was used for the two surfaces.

(Evaluation Sample 2)

Evaluation sample 2 illustrated in FIG. 4 was prepared by attaching a coverlay to a copper-clad laminate including a copper foil which had a thickness of 35 μm and whose surface was subjected to a Copperbrite treatment, the coverlay being obtained by applying an adhesive composition to a "Kapton 100H" polyimide film manufactured by Du Pont-Toray Co., Ltd. so as to have a thickness of 45 to 55 μm. The coverlay was attached by thermocompression bonding at a pressing pressure of 3 MPa and a heating temperature of 180° C. for a pressing time of 45 minutes. A copper-clad laminate obtained by bonding a copper foil having a thickness of 35 μm to a polyimide film (Kapton 100H) having a thickness of 25 μm with an epoxy resin-based adhesive was used as the copper-clad laminate. The surfaces of the copper foil were subjected to a rustproofing treatment with Copperbrite as in Evaluation sample 1.

(Evaluation Sample 3)

Evaluation sample 3 was prepared as in Evaluation sample 2 except that, in the preparation of Evaluation sample 2 in FIG. 4, an electroless nickel plating process was performed on the copper-clad laminate to form a surface treatment layer having a thickness of 0.1 μm on a surface of the copper foil.

(Evaluation Sample 4)

In the preparation of Evaluation sample 4 in FIG. 5, first, a coverlay was formed by applying an adhesive composition to a "Kapton 100H" polyimide film manufactured by Du Pont-Toray Co., Ltd. so as to have a thickness of 45 to 55 μm. Next, a circular hole having a diameter of 1.5 mm was formed in the coverlay. The coverlay was then placed on a copper-clad laminate including a copper foil which had a thickness of 35 μm and whose surface was subjected to a Copperbrite treatment. The coverlay and the copper-clad laminate were heated under pressure to cure an adhesive layer. Thus, Evaluation sample 4 was prepared. The heating under pressure was performed by thermocompression bonding at a pressing pressure of 3 MPa and a heating temperature of 180° C. for a pressing time of 45 minutes. A copper foil that had been subjected to a rustproofing treatment with Copperbrite by the same procedure as that for Evaluation sample 1 was used as the copper foil.

<Evaluation>

For Evaluation samples 1 to 4 prepared using the adhesive compositions of Examples 1 to 7 and Comparative Examples 1 to 10, evaluations of outflow, peel strengths 1 to 6, reflow heat resistance, and solder heat resistance were conducted in accordance with the methods described below. Table III shows the evaluation results. Note that the symbol "-" in evaluation items in Table III means "unevaluated (could not be evaluated)". The symbol (*) in the table means that permeation of an ATF oil was observed.

(Peel strength)

Peel strength was measured as peeling strength measured in accordance with JIS-K-6854-2:1999 "Adhesives—Determination of peel strength of bonded assemblies—Part 2: 180° peel" under the conditions described below.

This peel strength was measured by using an "Autograph AG-IS" tensile testing machine manufactured by Shimadzu Corporation. In the measurement of the peel strength, the entire edge of the copper-clad laminate of Evaluation sample 2 or Evaluation sample 3 was held, and a polyimide film was fixed. In this state, the peel strength was measured while applying a peel force.

Peel strength 1: Initial peel strength of Evaluation sample 2 at room temperature after the Evaluation sample 2 was prepared Peel strength 2: Peel strength of Evaluation sample 2 at room temperature after the Evaluation sample 2 was allowed to stand at 150° C. for 1,000 hours Peel strength 3: Peel strength of Evaluation sample 3 at room temperature after the Evaluation sample 3 subjected to nickel plating process was allowed to stand at 150° C. for 1,000 hours Peel strength 4: Peel strength of Evaluation sample 2 at room temperature after the Evaluation sample 2 was immersed in a "TOYOTA genuine Auto Fluid (WS)" ATF oil manufactured by Toyota Motor Corporation and allowed to stand in this state at 150° C. for 1,000 hours Peel strength 5: Initial peel strength of Evaluation sample 2 at 150° C. after the Evaluation sample 2 was prepared Peel strength 6: Peel strength of Evaluation sample 1 at room temperature after the Evaluation sample 1 was allowed to stand at 85° C. and 85% for 1,000 hours Peel strength 7: Peel strength of Evaluation sample 2 at room temperature after the Evaluation sample 2 was allowed to stand in oil mist of a "TOYOTA genuine Auto Fluid (WS)" ATF oil manufactured by Toyota Motor Corporation at 150° C. for 1,000 hours (Reflow Heat Resistance)

Reflow heat resistance was evaluated by allowing Evaluation sample 1 or Evaluation sample 2 to stand in a thermostatic chamber at 260° C. for one minute, and then observing the occurrence or non-occurrence of deformation. The evaluation criteria are as follows. In Table III, the reflow heat resistance 1 shows the result obtained using Evaluation sample 1, and the reflow heat resistance 2 shows the result obtained using Evaluation sample 2.

A: Deformation is not observed.
B: Deformation is observed.

(Outflow)

Figure 6:
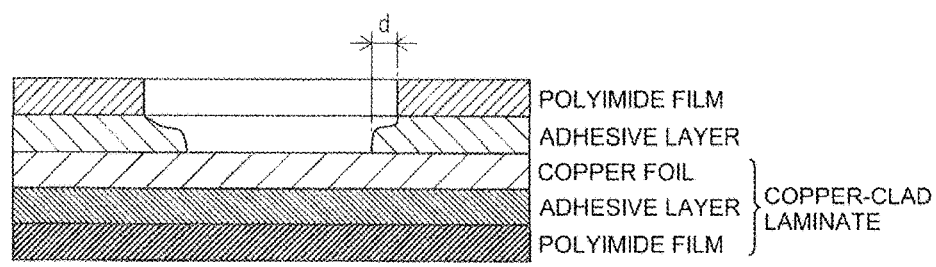
FIG. 6 is a schematic cross-sectional view illustrating an outflow evaluation in Examples of the present invention.

Outflow was evaluated by pressing Evaluation sample 4 having a circular hole at 160° C. and 3 MPa for 45 minutes and then measuring an outflow distance d (refer to FIG. 6) of an adhesive protruding from an inner surface of the circular hole in plan view. An outflow distance of less than 200 μm is required for each adhesive composition.

(Solder Heat Resistance)

Solder heat resistance was evaluated by immersing Evaluation sample 1 in a solder bath heated at 340° C. for one minute, then pulling up the sample, and visually observing the presence or absence of swelling. In the table, "A" denotes that "swelling is not observed", and "B" denotes "swelling is observed".

long-term peel strengths. Evaluation samples prepared using the adhesive compositions of Examples 1 to 5 did not have particular problems in the evaluation of the peel strength 4 corresponding to long-term oil resistance. Regarding Examples 6 and 7, although the long-term oil resistance was not good, there were no problems in other characteristics.

Evaluation samples 1 and 2 prepared using the adhesive compositions of Examples 1 to 7 tended to have good results in the evaluation of the reflow heat resistance 1 and 2. Evaluation sample 1 used in the reflow heat resistance 1 has a structure in which a copper foil is stacked on each of both surfaces of a polyimide film with an adhesive layer therebetween (refer to FIG. 3). Therefore, Evaluation sample 1 has a structure in which peel strength is easily decreased by a so-called popcorn phenomenon in which when a solvent contained in an adhesive layer composition is vaporized during reflow, the resulting gas remains in an adhesive layer because the gas is not easily released from the adhesive layer. Accordingly, it is believed that the Evaluation samples 1 prepared using the adhesive compositions of Examples 1 to 7 have good peel strength as a result of the suppression of the occurrence of the popcorn phenomenon during reflow.

Reference Examples 1 to 4

Adhesive compositions of Reference Examples 1 to 4 were prepared as in Comparative Example 3 except that inorganic fillers having the average particle sizes and the aspect ratios shown in Table IV were used. Inorganic fillers B1 to B5 shown in Table IV are as follows.

B1: "MICRO ACE K1" manufactured by Nippon Talc Co., Ltd.

TABLE III

| | Evaluation | | | | | | | | |
|---|---|---|---|---|---|---|---|---|---|
| | Peel strength | | | | | | 260° C.-Reflow heat resistance | | Outflow (μm) | Solder heat resistance |
| | 1 | 2 | 3 | 4 | 5 | 6 | 1 | 2 | | |
| Example 1 | 12 | 7 | 12 | 7 | 7 | 12 | A | A | 100 | A |
| Example 2 | 11 | 7 | 10 | 7 | 6 | 8 | A | A | 100 | A |
| Example 3 | 11 | 7 | 12 | 6 | 6 | 11 | A | A | 90 | A |
| Example 4 | 11 | 7 | 11 | 6 | 4 | 10 | A | A | 100 | A |
| Example 5 | 12 | 6 | 12 | 6 | 5 | 13 | A | A | 190 | A |
| Example 6 | 13 | 7 | 13 | <1 (*) | 2 | 13 | A | A | 180 | A |
| Example 7 | 13 | 9 | 13 | <1 (*) | 2 | 12 | A | A | 110 | A |
| Com. Ex. 1 | 11 | 4 | 11 | 7 | 7 | 6 | B | A | 80 | B |
| Com. Ex. 2 | 11 | 3 | 11 | — | 2 | 5 | B | A | 120 | B |
| Com. Ex. 3 | 8 | 4 | 12 | 6 | 4 | 7 | B | A | 80 | B |
| Com. Ex. 4 | 11 | 4 | 11 | — | 2 | — | B | A | 120 | B |
| Com. Ex. 5 | 10 | 9 | 11 | — | — | — | — | A | 120 | B |
| Com. Ex. 6 | 13 | 6 | 14 | <1 (*) | 1.5 | 9 | B | B | 180 | B |
| Com. Ex. 7 | 9 | 4 | 11 | 6 | 3 | — | B | B | 230 | B |
| Com. Ex. 8 | 5 | 3 | — | — | — | — | B | A | 160 | B |
| Com. Ex. 9 | 13 | 13 | 13 | <1 (*) | 1 | 13 | B | A | 300 | B |

Com. Ex.: Comparative Example

As is apparent from Table III, evaluation samples prepared using the adhesive compositions of Examples 1 to 7 had higher peel strengths, better reflow heat resistance, and better solder heat resistance than those of evaluation samples prepared using the adhesive compositions of Comparative Examples 1 to 9. Specifically, Evaluation samples prepared using the adhesive compositions of Examples 1 to 7 did not have particular problems in the evaluation of the peel strength 1 corresponding to an initial peel strength, and the evaluations of the peel strengths 2 and 3 corresponding to B2: "MICRO ACE P8" manufactured by Nippon Talc Co., Ltd.

B3: "GAT-40" manufactured by Nippon Talc Co., Ltd.

B4: "MICRO ACE P2" manufactured by Nippon Talc Co., Ltd.

B5: "MISTRON VAPOR TALC" manufactured by Nihon Mistron Co., Ltd.

Evaluation samples 1 to 4 were prepared using the adhesive compositions, and the peel strengths and reflow heat resistance described above were evaluated. Table IV shows the evaluation results. The evaluation results of Comparative Example 3 are also shown in Table IV.

TABLE IV

| | Composition (parts by mass) | | | | | Evaluation | | | | | | |
|---|---|---|---|---|---|---|---|---|---|---|---|---|
| | Polyimide | | Inorganic filler | | | | Peel strength (N/cm) | | | | | Reflow heat resistance |
| | Component | Amount blended | Type | Amount blended | Aspect ratio | Average particle size (µm) | 1 | 2 | 3 | 4 | 5 | 1 | 2 |
| Comparative Example 3 | A4 | 100 | B1 | 45 | 8 | 8 | 8 | 4 | 12 | 6 | 4 | B | A |
| Reference Example 1 | A4 | 100 | B2 | 45 | 8 | 40 | 9 | 9 | — | — | — | — | A |
| Reference Example 2 | A4 | 100 | B3 | 45 | 10 | 10 | 8 | 9 | — | — | — | — | A |
| Reference Example 3 | A4 | 100 | B4 | 45 | 7 | 20 | 8 | 9 | — | — | — | — | A |
| Reference Example 4 | A4 | 100 | B5 | 45 | 3 | 20 | 7 | 5 | — | — | — | — | A |

As is apparent from Table IV, the peel strengths 1 and 2 and the reflow heat resistance 2 of Evaluation samples 1 to 4 prepared using the adhesive compositions of Reference Examples 1 to 4 were substantially equal to or higher than those of Comparative Example 3. Accordingly, in the cases where inorganic fillers having average particle sizes and aspect ratios in the ranges of Reference Examples 1 to 4 are incorporated in the adhesive compositions of Examples 1 to 7, the peel strengths and heat resistance substantially equal to or higher than those of Evaluation samples 1 to 4 prepared using the adhesive compositions of Examples 1 to 7 are believed to be obtained.

(Comprehensive Reliability Evaluation)

Comprehensive reliability including flame retardancy and oil-mist resistance in addition to the heat resistance, moisture resistance, outflow properties, and oil resistance were evaluated using samples having different compounding ratios of an aromatic diamine to a siloxane diamine in the diamine component of the siloxane-modified polyimide. In a flame retardant test, the standard sample described above was prepared, and the V-0 flame retardancy was measured. The oil-mist resistance was determined in accordance with the method for measuring the peel strength 7 described above. Table V shows the results.

Example 3, in which the compounding ratio of the aromatic diamine to the siloxane diamine in the diamine component of the siloxane-modified polyimide is 40:60, satisfies all characteristics and thus shows good comprehensive reliability. In Example 7, in which the ratio is 30:70, all the characteristics except for oil resistance satisfy the acceptability criteria. These results show that a ratio of 30:70 also does not have a problem in applications in which oil resistance is not necessary.

(Solder Heat Resistance)

Solder heat resistance of an Example was evaluated using a general-purpose product as a comparative sample. Evaluation sample 1 was prepared using the adhesive composition of Example 1. Furthermore, an evaluation sample produced using a common epoxy-based adhesive composition used in general-purpose printed wiring boards was prepared as the comparative sample. The samples were immersed in a solder bath heated at a predetermined temperature for one minute and then pulled up. The presence or absence of swelling was examined by visual observation. In the table, "A" denotes that "swelling is not observed", and "B" denotes "swelling is observed". Table VI shows the evaluation results of the samples.

TABLE V

| | | | | Example 3 | Example 7 | Comparative Example 9 | Comparative Example 10 |
|---|---|---|---|---|---|---|---|
| Adhesive | Modified polyimide composition (compounding ratio) | Acid anhydride | BPDA | 100 | 100 | 100 | 100 |
| | | Diamine | PSA | 60 | 70 | 80 | 90 |
| | | | BAPP | 40 | 30 | 20 | 10 |
| Evaluation | | | Acceptability criteria | | | | |
| | V-0 flame retardancy | | 0/5 combustion | 0/5 combustion | 0/5 combustion | 0/5 combustion | 5/5 combustion |
| | Outflow (µm) | | <200 | 90 | 110 | 300 | 730 |
| | Peel strength (N/cm) | 2 | ≥3.4 | 7 | 9 | 13 | 11 |
| | | 6 | ≥2.0 | 11 | 12 | 13 | 11 |
| | | 4 | | 6 | <1 (*) | <1 (*) | <1 (*) |
| | | 7 | | 7 | <1 (*) | <1 (*) | <1 (*) |

TABLE VI

| Solder temperature | Example 1 | Comparative sample |
| --- | --- | --- |
| 260° C. | A | A |
| 280° C. | A | A |
| 300° C. | A | A |
| 320° C. | A | B |
| 340° C. | A | B |
| 360° C. | B | B |

As is apparent from Table VI, in the Evaluation sample 1, which was prepared using the adhesive composition of Example 1, swelling was not observed even at a solder temperature of 340° C. Thus, the Evaluation sample 1 had good solder heat resistance. In contrast, in the comparative sample, which was prepared using the common epoxy-based adhesive composition, the upper limit of solder heat resistance was found to be 300° C.

(175° C.-Heat-resistant Reliability)

In recent years, requirements for 175° C.-heat-resistant reliability (Class 3) exceeding 150° C.-heat-resistant reliability (Class 2) have been increasing in automobile applications. However, there have been no reports relating to a printed wiring board, and the applications of such a printed wiring board have not been realized. In view of this, an evaluation of the 175° C.-heat-resistant reliability was conducted by using Evaluation sample 3 prepared using the adhesive composition of Example 1. Regarding the evaluation method, the sample was allowed to stand in an atmosphere at 175° C. for a predetermined time, and peel strength at room temperature was then measured. Table VII shows the evaluation results.

TABLE VII

| Heating time at 175° C. (h) | Peel strength (N/cm) |
| --- | --- |
| 0 | 12.0 |
| 500 | 8.5 |
| 1000 | 6.5 |

As is apparent from Table VII, the Evaluation sample 3 obtained by applying the adhesive composition of Example 1 to a copper-clad laminate whose surface was subjected to a nickel plating process had a peel strength of 6 N/cm or more even after being allowed to stand at 175° C. for 1,000 hours. Accordingly, the Evaluation sample 3 can be suitably used also in automobile applications for which the class 3 classification is required.

INDUSTRIAL APPLICABILITY

The adhesive composition for a printed wiring board of the present invention can provide an adhesive layer having a good heat resistance. Accordingly, the adhesive composition for a printed wiring board can be suitably used in a bonding film for a printed wiring board, a coverlay, a copper-clad laminate, and a printed wiring board, and in particular, can be suitably used in a printed wiring board used in a high-temperature environment and an environment in which an oil is dispersed.

REFERENCE SIGNS LIST 1 printed wiring board
2 base film
3 conductive pattern
3A copper foil
30 base conductor
31 surface treatment layer
4 coverlay
40 cover film
41 adhesive layer
5 copper-clad laminate

The invention claimed is:

1. An adhesive composition for a printed wiring board, the adhesive composition comprising:
a siloxane-modified polyimide that includes a first structural unit represented by formula (1) below and a second structural unit represented by formula (2) below;
an epoxy resin having a content of 8 parts by mass or less relative to 100 parts by mass of the siloxane-modified polyimide;
an inorganic filler,
wherein the siloxane-modified polyimide has a weight-average molecular weight (Mw) of 25,000 or more and 150,000 or less,
a content of the inorganic filler is 10 parts by mass or more and 100 parts by mass or less relative to 100 parts by mass of the siloxane-modified polyimide,
wherein the adhesive composition further comprises a phenolic resin,
wherein formula 1 and formula 2 are:

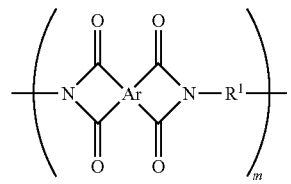

(1)

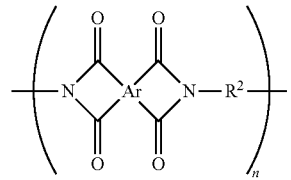

(2)

wherein in formulas (1) and (2), Ar represents a tetravalent aromatic tetracarboxylic acid residue represented by formula 3 and formula 4,
wherein formula (3) and formula (4) are:

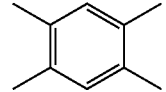

(3)

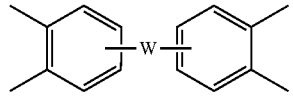

(4)

wherein W represents a single bond, a divalent hydrocarbon group having one to fifteen carbon atoms, —O—, —S—, —SO$_2$—, —NH—, or —CONH—,
wherein R$^1$ represents a divalent diamine siloxane residue, wherein R² represents a divalent aromatic diamine residue and includes divalent groups represented by formula 6, formula 7, or formula 8, wherein formula 6, formula 7, and formula 8 are:

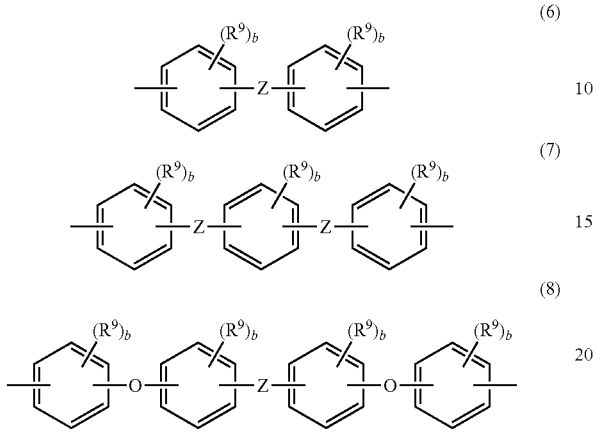

wherein each R9 independently represents a monovalent hydrocarbon group or alkoxy group having one to six carbon atoms, wherein Z represents a single bond, a divalent hydrocarbon group having one to fifteen carbon atoms, —O—, —S—, —SO₂—, —NH—, or —CONH—, and wherein b represents an integer of 0 to 4, wherein m represents a molar ratio of the first structural unit to the total structural units of the siloxane-modified polyimide and is 0.35 or more and 0.75 or less, wherein n represents a molar ratio of the second structural unit to the total structural units of the siloxane-modified polyimide and is 0.25 or more and 0.65 or less, and wherein a total of m and n does not exceed 1.

2. The adhesive composition for a printed wiring board according to claim 1, wherein m is 0.35 or more and 0.65 or less, and n is 0.35 or more and 0.65 or less.

3. The adhesive composition for a printed wiring board according to claim 1, wherein the inorganic filler has an average particle size of 2 μm or more and 20 μm or less.

4. The adhesive composition for a printed wiring board according to claim 1, wherein the inorganic filler has a plate-like shape, and
the inorganic filler has an aspect ratio of 5 or more and 100 or less.

5. A printed wiring board comprising:
a base film;
a conductive pattern stacked on the base film either directly or with another layer therebetween; and
a coverlay stacked on the base film and the conductive pattern,
wherein the coverlay comprises a cover film; and an adhesive layer stacked on one surface of the cover film formed from an adhesive composition,
wherein the coverlay is stacked so that the adhesive layer contacts with the base film and the conductive pattern,
wherein the adhesive composition comprises:
a siloxane-modified polyimide that includes a first structural unit represented by formula (1) below and a second structural unit represented by formula (2) below;

an epoxy resin having a content of 8 parts by mass or less relative to 100 parts by mass of the siloxane-modified polyimide;
an inorganic filler,
wherein the siloxane-modified polyimide has a weight-average molecular weight (Mw) of 25,000 or more and 150,000 or less,
a content of the inorganic filler is 10 parts by mass or more and 100 parts by mass or less relative to 100 parts by mass of the siloxane-modified polyimide,
wherein the adhesive composition further comprises a phenolic resin,
wherein a peel strength between the cover film and the conductive pattern after the printed wiring board is allowed to stand in air at 150° C. for 1,000 hours is 6 N/cm or more,
wherein formula 1 and formula 2 are:

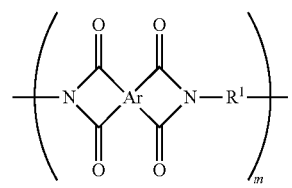

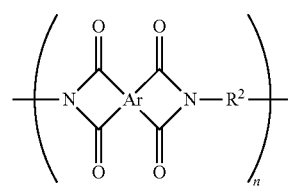

wherein in formulas (1) and (2), Ar represents a tetravalent aromatic tetracarboxylic acid residue represented by formula 3 and formula 4,
wherein formula (3) and formula (4) are:

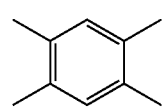

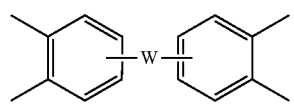

wherein W represents a single bond, a divalent hydrocarbon group having one to fifteen carbon atoms, —O—, —S—, —SO₂—, —NH—, or —CONH—,
wherein R¹ represents a divalent diamine siloxane residue,
wherein R² represents a divalent aromatic diamine residue and includes divalent groups represented by formula 6, formula 7, or formula 8, wherein formula 6, formula 7, and formula 8 are:

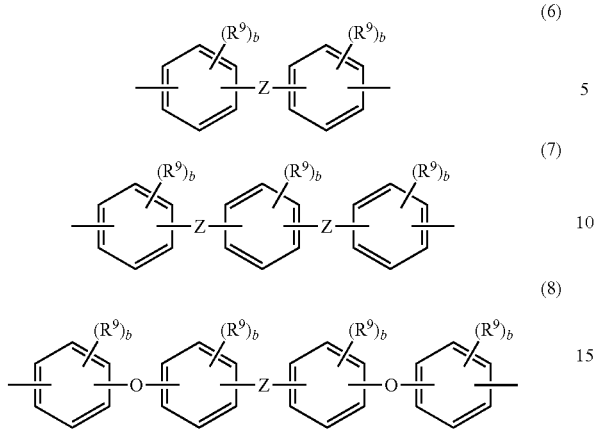

wherein each R9 independently represents a monovalent hydrocarbon group or alkoxy group having one to six carbon atoms, wherein Z represents a single bond, a divalent hydrocarbon group having one to fifteen carbon atoms, —O—, —S—, —SO$_2$—, —NH—, or —CONH—, and wherein b represents an integer of 0 to 4, wherein m represents a molar ratio of the first structural unit to the total structural units of the siloxane-modified polyimide and is 0.35 or more and 0.75 or less, wherein n represents a molar ratio of the second structural unit to the total structural units of the siloxane-modified polyimide and is 0.25 or more and 0.65 or less, and wherein a total of m and n does not exceed 1.

6. The printed wiring board according to claim 5, wherein the conductive pattern includes a base conductor, and a surface treatment layer formed on at least a part of an outer surface of the base conductor, and the surface treatment layer contains nickel (Ni), tin (Sn), or aluminum (Al) as a main component.

7. The printed wiring board according to claim 5, wherein a peel strength between the cover film and the conductive pattern after the printed wiring board is immersed in an automatic transmission fluid (ATF) oil at 150° C. for 1,000 hours is 2 N/cm or more.

8. The printed wiring board according to claim 5, having a solder heat resistance at 340° C. for 60 seconds.

9. A bonding film for a printed wiring board, the bonding film being formed from an adhesive composition,
wherein the adhesive composition comprises:
a siloxane-modified polyimide that includes a first structural unit represented by formula (1) below and a second structural unit represented by formula (2) below;
an epoxy resin having a content of 8 parts by mass or less relative to 100 parts by mass of the siloxane-modified polyimide;
an inorganic filler,
wherein the siloxane-modified polyimide has a weight-average molecular weight (Mw) of 25,000 or more and 150,000 or less,
a content of the inorganic filler is 10 parts by mass or more and 100 parts by mass or less relative to 100 parts by mass of the siloxane-modified polyimide,
wherein the adhesive composition further comprises a phenolic resin, wherein, when the adhesive composition is applied to a cover film to form an adhesive layer on the cover film, and a copper foil is attached to the adhesive layer to prepare an evaluation sample, a peel strength between the cover film and the copper foil after the evaluation sample is allowed to stand in air at 150° C. for 1,000 hours is 6 N/cm or more, wherein formula 1 and formula 2 are:

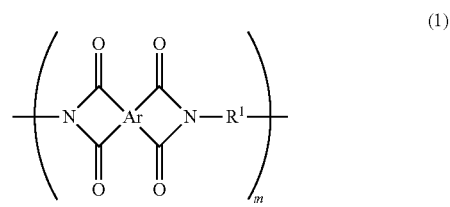

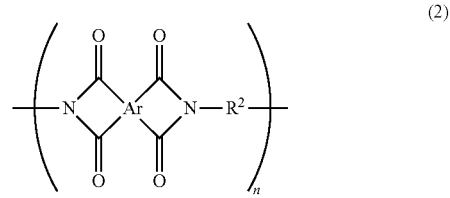

wherein in formulas (1) and (2), Ar represents a tetravalent aromatic tetracarboxylic acid residue represented by formula 3 and formula 4, wherein formula (3) and formula (4) are:

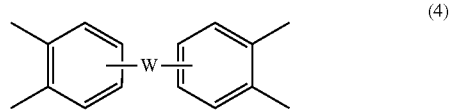

wherein W represents a single bond, a divalent hydrocarbon group having one to fifteen carbon atoms, —O—, —S—, —SO$_2$—, —NH—, or —CONH—, wherein R$^1$ represents a divalent diamine siloxane residue, wherein R$^2$ represents a divalent aromatic diamine residue and includes divalent groups represented by formula 6, formula 7, or formula 8, wherein formula 6, formula 7, and formula 8 are:

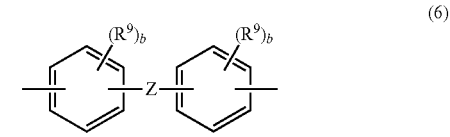

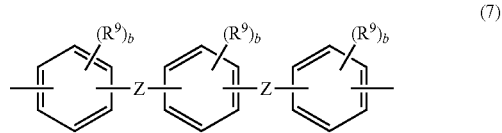

-continued (8)

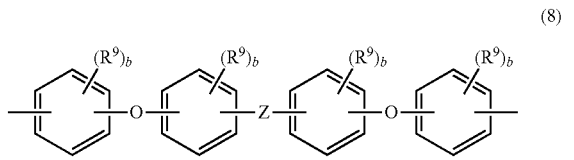

wherein each R9 independently represents a monovalent hydrocarbon group or alkoxy group having one to six carbon atoms, wherein Z represents a single bond, a divalent hydrocarbon group having one to fifteen carbon atoms, —O—, —S—, —SO$_2$—, —NH—, or —CONH—, and wherein b represents an integer of 0 to 4, wherein m represents a molar ratio of the first structural unit to the total structural units of the siloxane-modified polyimide and is 0.35 or more and 0.75 or less, wherein n represents a molar ratio of the second structural unit to the total structural units of the siloxane-modified polyimide and is 0.25 or more and 0.65 or less, and wherein a total of m and n does not exceed 1.

10. A coverlay for a printed wiring board, the coverlay comprising:

a cover film; and an adhesive layer stacked on one surface of the cover film and formed from an adhesive composition, wherein the adhesive composition comprises:

a siloxane-modified polyimide that includes a first structural unit represented by formula (1) below and a second structural unit represented by formula (2) below;

an epoxy resin having a content of 8 parts by mass or less relative to 100 parts by mass of the siloxane-modified polyimide;

an inorganic filler, wherein the siloxane-modified polyimide has a weight-average molecular weight (Mw) of 25,000 or more and 150,000 or less, a content of the inorganic filler is 10 parts by mass or more and 100 parts by mass or less relative to 100 parts by mass of the siloxane-modified polyimide, wherein the adhesive composition further comprises a phenolic resin, wherein, when the adhesive composition is applied to a cover film to form an adhesive layer on the cover film, and a copper foil is attached to the adhesive layer to prepare an evaluation sample, a peel strength between the cover film and the copper foil after the evaluation sample is allowed to stand in air at 150° C. for 1,000 hours is 6 N/cm or more, wherein formula 1 and formula 2 are:

(1)

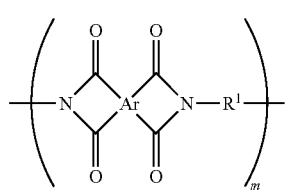

(2)

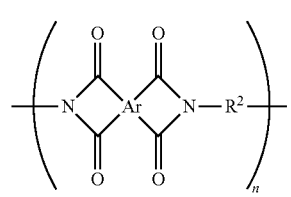

wherein in formulas (1) and (2), Ar represents a tetravalent aromatic tetracarboxylic acid residue represented by formula 3 and formula 4, wherein formula (3) and formula (4) are:

(3)

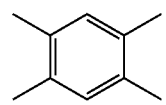

(4)

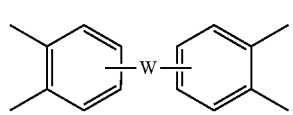

wherein W represents a single bond, a divalent hydrocarbon group having one to fifteen carbon atoms, —O—, —S—, —SO$_2$—, —NH—, or —CONH—, wherein R$^1$ represents a divalent diamine siloxane residue, wherein R$^2$ represents a divalent aromatic diamine residue and includes divalent groups represented by formula 6, formula 7, or formula 8, wherein formula 6, formula 7, and formula 8 are:

(6)

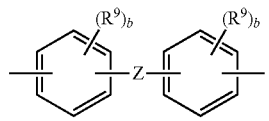

(7)

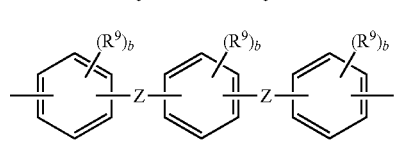

(8)

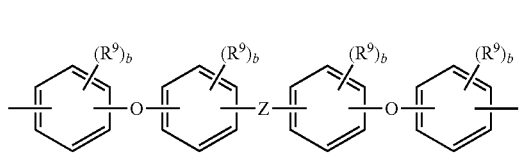

wherein each R9 independently represents a monovalent hydrocarbon group or alkoxy group having one to six carbon atoms, wherein Z represents a single bond, a divalent hydrocarbon group having one to fifteen carbon atoms, —O—, —S—, —SO$_2$—, —NH—, or —CONH—, and wherein b represents an integer of 0 to 4, wherein m represents a molar ratio of the first structural unit to the total structural units of the siloxane-modified polyimide and is 0.35 or more and 0.75 or less, wherein n represents a molar ratio of the second structural unit to the total structural units of the siloxane-modified polyimide and is 0.25 or more and 0.65 or less, and wherein a total of m and n does not exceed 1.

11. A copper-clad laminate comprising:

a base film;

an adhesive layer stacked on one or both surfaces of the base film and formed from an adhesive composition for a printed wiring; and a copper foil stacked on the adhesive layer, wherein the adhesive composition comprises:

a siloxane-modified polyimide that includes a first structural unit represented by formula (1) below and a second structural unit represented by formula (2) below;

an epoxy resin having a content of 8 parts by mass or less relative to 100 parts by mass of the siloxane-modified polyimide;

an inorganic filler, wherein the siloxane-modified polyimide has a weight-average molecular weight (Mw) of 25,000 or more and 150,000 or less, a content of the inorganic filler is 10 parts by mass or more and 100 parts by mass or less relative to 100 parts by mass of the siloxane-modified polyimide, wherein the adhesive composition further comprises a phenolic resin, wherein, when the adhesive composition is applied to a cover film to form an adhesive layer on the cover film, and a copper foil is attached to the adhesive layer to prepare an evaluation sample, a peel strength between the cover film and the copper foil after the evaluation sample is allowed to stand in air at 150° C. for 1,000 hours is 6 N/cm or more, wherein formula 1 and formula 2 are:

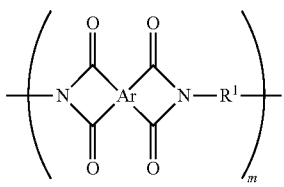
(1)

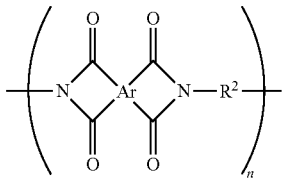
(2)

wherein in formulas (1) and (2), Ar represents a tetravalent aromatic tetracarboxylic acid residue represented by formula 3 and formula 4, wherein formula (3) and formula (4) are:

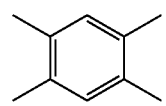
(3)

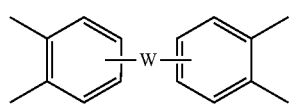
(4)

wherein W represents a single bond, a divalent hydrocarbon group having one to fifteen carbon atoms, —O—, —S—, —SO$_2$—, —NH—, or —CONH—, wherein R$^1$ represents a divalent diamine siloxane residue, wherein R$^2$ represents a divalent aromatic diamine residue and includes divalent groups represented by formula 6, formula 7, or formula 8, wherein formula 6, formula 7, and formula 8 are:

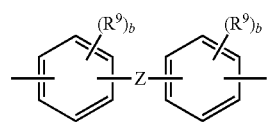
(6)

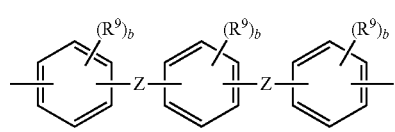
(7)

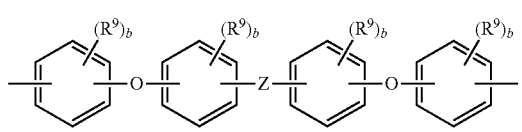
(8)

wherein each R9 independently represents a monovalent hydrocarbon group or alkoxy group having one to six carbon atoms, wherein Z represents a single bond, a divalent hydrocarbon group having one to fifteen carbon atoms, —O—, —S—, —SO$_2$—, —NH—, or —CONH—, and wherein b represents an integer of 0 to 4, wherein m represents a molar ratio of the first structural unit to the total structural units of the siloxane-modified polyimide and is 0.35 or more and 0.75 or less, wherein n represents a molar ratio of the second structural unit to the total structural units of the siloxane-modified polyimide and is 0.25 or more and 0.65 or less, and wherein a total of m and n does not exceed 1.

* * * * *

UNITED STATES PATENT AND TRADEMARK OFFICE
CERTIFICATE OF CORRECTION

PATENT NO. : 10,244,626 B2
APPLICATION NO. : 14/916191
DATED : March 26, 2019
INVENTOR(S) : Takayuki Yonezawa et al.

It is certified that error appears in the above-identified patent and that said Letters Patent is hereby corrected as shown below:

In the Claims

In Claim 1, Column 36, Line 49, replace "by formula 3 and formula 4" with "by formula 3 or formula 4"

In Claim 5, Column 37, Lines 59-60, replace "the cover film formed from" with "the cover film and formed from"

In Claim 5, Column 38, Line 43, replace "by formula 3 and formula 4" with "by formula 3 or formula 4"

In Claim 9, Column 40, Line 30, replace "by formula 3 and formula 4" with "by formula 3 or formula 4"

In Claim 10, Column 42, Line 13, replace "by formula 3 and formula 4" with "by formula 3 or formula 4"

In Claim 11, Column 43, Line 57, replace "by formula 3 and formula 4" with "by formula 3 or formula 4"

Signed and Sealed this
Ninth Day of July, 2019

Andrei Iancu
*Director of the United States Patent and Trademark Office*